(12) United States Patent
Sabbarwal et al.

(10) Patent No.: US 11,537,309 B2
(45) Date of Patent: Dec. 27, 2022

(54) SAVE-RESTORE IN INTEGRATED CIRCUITS

(71) Applicant: TEXAS INSTRUMENTS INCORPORATED, Dallas, TX (US)

(72) Inventors: Puneet Sabbarwal, Bangalore (IN); Indu Prathapan, Bangalore (IN)

(73) Assignee: Texas Instmments Incorporated, Dallas, TX (US)

( * ) Notice: Subject to any disclaimer, the term of this patent is extended or adjusted under 35 U.S.C. 154(b) by 0 days.

(21) Appl. No.: 16/995,542

(22) Filed: Aug. 17, 2020

(65) Prior Publication Data

US 2020/0379649 A1    Dec. 3, 2020

Related U.S. Application Data

(63) Continuation of application No. 16/235,897, filed on Dec. 28, 2018, now Pat. No. 10,747,466.

(51) Int. Cl.
*G06F 3/06* (2006.01)
*G06F 30/30* (2020.01)

(52) U.S. Cl.
CPC ............ *G06F 3/065* (2013.01); *G06F 3/0619* (2013.01); *G06F 3/0659* (2013.01); *G06F 3/0673* (2013.01); *G06F 30/30* (2020.01)

(58) Field of Classification Search
None
See application file for complete search history.

(56) References Cited

U.S. PATENT DOCUMENTS

| 5,386,390 | A | 1/1995 | Okitaka |
| 5,568,416 | A | 10/1996 | Kawana et al. |
| 6,614,703 | B2 | 9/2003 | Pitts et al. |
| 6,691,268 | B1 | 2/2004 | Chin |
| 7,957,172 | B2 | 7/2011 | Penzes |
| 2002/0027803 | A1 | 3/2002 | Matsui |
| 2002/0141237 | A1 | 10/2002 | Goda et al. |
| 2002/0141242 | A1 | 10/2002 | Noguchi et al. |
| 2002/0162037 | A1 | 10/2002 | Woods et al. |

(Continued)

OTHER PUBLICATIONS

International Search Report in International Patent Application No. PCT/US2019/067358, dated Mar. 19, 2020, 5 pages.

*Primary Examiner* — Kaushikkumar M Patel
(74) *Attorney, Agent, or Firm* — Carl G. Peterson; Frank D. Cimino

(57) ABSTRACT

In described examples, circuitry for saving and restoring a design block state includes first memories configured to receive, and store in different first memories in a first order, different portions of first data; and a second memory coupled to first memories. First memories with the most memory cells have N memory cells. First memories with fewer memory cells have M memory cells. When saving state, first data from different first memories is written in a second order to different corresponding regions of the second memory as second data. The second order repeats portions of the first data stored in sequentially first N mod M cells, determined using the first order, of corresponding first memories with fewer cells. When restoring state, second data is read from the second memory and stored, in the first order, in corresponding first memories; repeated portions are repeatedly stored in corresponding first memories with fewer cells.

20 Claims, 29 Drawing Sheets

(56) References Cited

U.S. PATENT DOCUMENTS

| | | |
|---|---|---|
| 2005/0114612 A1 | 5/2005 | Bombal |
| 2007/0086260 A1 | 4/2007 | Sinclair |
| 2007/0150780 A1* | 6/2007 | Shimooka ............. G06F 1/3203 |
| | | 714/726 |
| 2007/0168776 A1 | 7/2007 | Grose et al. |
| 2008/0092002 A1 | 4/2008 | Shimooka |
| 2012/0002470 A1 | 1/2012 | Fatatsuyama et al. |
| 2015/0323594 A1* | 11/2015 | Khullar .......... G01R 31/318552 |
| | | 714/727 |
| 2015/0331047 A1 | 11/2015 | Priel et al. |
| 2015/0346277 A1* | 12/2015 | Priel .................... G06F 1/3243 |
| | | 714/727 |
| 2015/0378890 A1 | 12/2015 | Lien et al. |
| 2016/0299834 A1 | 10/2016 | Tomizawa et al. |
| 2018/0088843 A1 | 3/2018 | Shallal et al. |
| 2018/0300208 A1* | 10/2018 | Oruganti ................ G11C 29/32 |

* cited by examiner

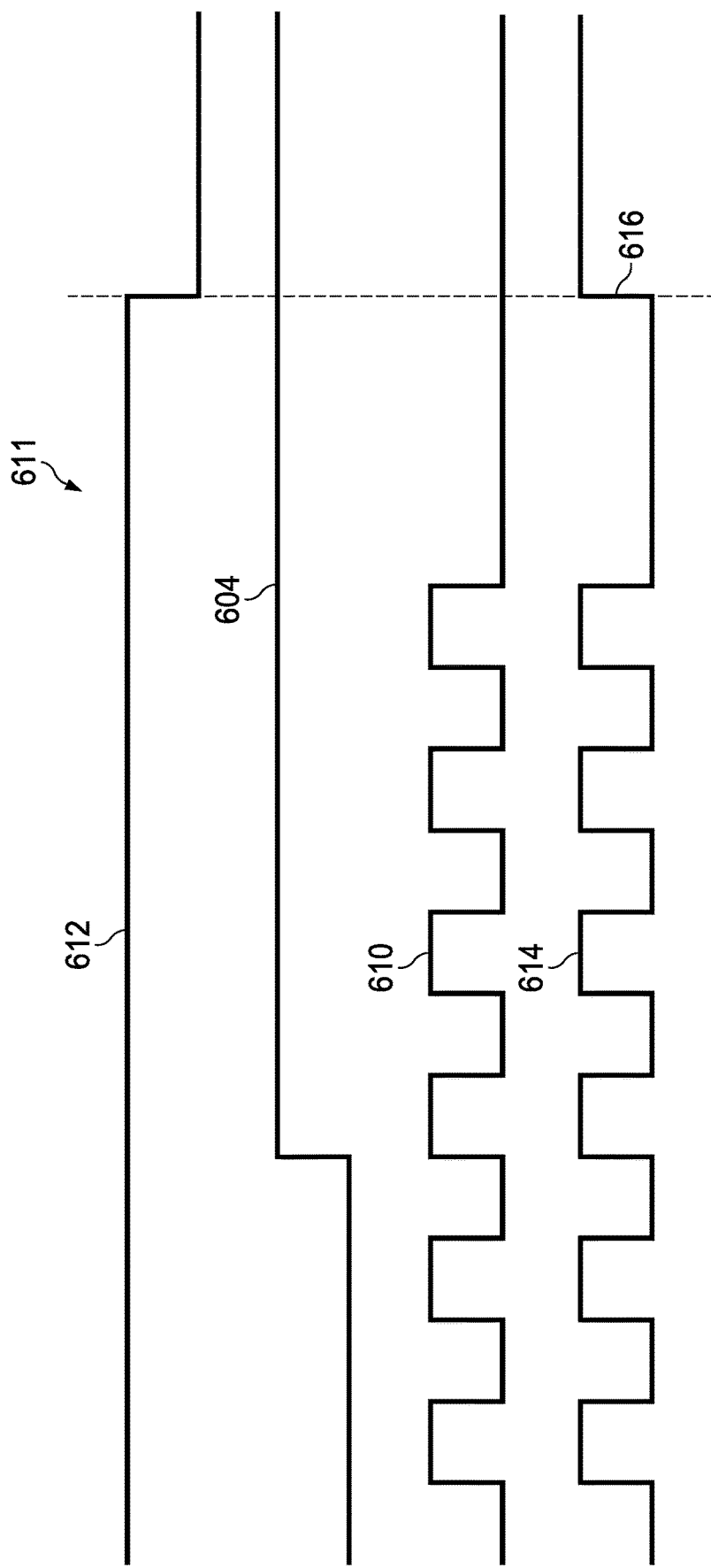

SAVE-RESTORE IN INTEGRATED CIRCUITS

CROSS-REFERENCE TO RELATED APPLICATIONS

This application is a continuation of U.S. patent application Ser. No. 16/235,897, filed on Dec. 28, 2018, the entirety of which is incorporated by reference.

BACKGROUND

This application relates generally to power saving in electronic circuitry, and more particularly to save-restore functionality in integrated circuits.

Integrated circuits (ICs) can comprise various functional blocks, such as input/output, control, encode, and decode. Systems direct power to ICs, and ICs direct power to component functional blocks, to keep ICs and functional blocks (respectively) active and enable them to perform their respective functions promptly on demand. ("Design block" is used herein to refer to either an IC or functional block, when context is applicable to both.) When the functions performed by the design block are not used, the design block can be left idle. However, even while idle, an active design block will continue to consume power to maintain a current state (also called a context or configuration of the design block) comprising the contents of memory elements of the design block, such as flip-flops and registers. If an active design block is powered down to reduce power consumption, its current state can be lost, which can result in an error or require re-initializing the design block, either of which will generally cost power and time to address.

Save-Restore (SR) is a way to enable a design block in a particular operational state to be powered down, and to later be powered back up and returned to the same operational state with reduced power and time cost. To perform SR, the operational state of a design block is stored in on-die memory prior to the design block powering down. When the design block is powered up again, the operational state information is retrieved from the on-die memory and used to recreate the operational state in the design block.

Scan chains are typically used in design-for-testing. Scan chains generally comprise clocked, serially connected flip-flops which are connected to be loaded with data stored by memory elements in a design block when a scan enable signal is asserted. Scan chain lengths (the numbers of cells (e.g., flip-flops) in different scan chains) can vary because of, for example, clock domain mixing restrictions, memory chains, physical design and floor plan requirements, and power domain merging. Scan elements (such as cells and control elements) are generally required to be within the same clock domain (clocked synchronously). Also, separate power domains generally have separate, dedicated scan chains which are active in the power modes provided by respective power domains when the respective power domain is "on" (active).

FIG. 1A shows an example block diagram 100 of a prior art circuit for using scan chains 102 to save a state of a design block. (For convenience, scan chains 102 are referred to as being numbered from the top scan chain 102, CHAIN 1, to the bottom scan chain 102, CHAIN 4.) Bits 104 representing the state of a design block are first loaded from design block memory elements into cells 106 of multiple scan chains 102. (Design blocks, and structure to load state information from design blocks into scan chains 102, are not shown.) Individual bits 104 correspond to states of respective memory elements in the design block. The scan chains 102 are connected to output to an SR control block 108. The SR control block 108 is connected to output control signals, including a clock 130, to the scan chains 102. The SR control block 108 is also connected to store bits 104 outputted from end cells 110 of respective scan chains 102 to a memory 112, where in FIG. 1A (and later Figures), an end cell 110 is intended to identify the cell farthest to the right in each respective chain. For example, CHAIN 1 includes five cells 106, where the fifth cell from left-to-right is also an end cell 110, in that it is connected to output its stored bit to the SR control block 108. As another example, CHAIN 3 (which includes fewer cells 106 as compared to CHAIN 1) includes three cells, where the third cell from left-to-right is also an end cell 110, again connected to output its stored bit 104 to the SR control block 108. The memory 112 has multiple rows 114 and columns 116 of memory cells 118. The SR control block 108 stores bits 104 to a row 114 of memory cells 118 at a time, by generally copying one bit 104 per scan chain 102 end cell 110 to a respective row 114 then being written. Thus, individual columns 116 of memory cells 118 correspond to individual respective scan chains 102; bits 104 read out from a scan chain 102 are stored into memory cells 118 in a corresponding column 116. Rows 114 are numbered one (1) to five (5) (five being the length of the longest of the scan chains 102), and columns 116 are numbered one (1) to four (4) (four being the number of scan chains 102). In FIGS. 1B through 1F, the arrow from the SR control block 108 to the memory 112 indicates the row 114 of memory 112 that has just been loaded with data from the scan chains 102.

FIG. 1B shows an example block diagram 120 of the prior art circuit for using scan chains 102 to save a state of a design block, after one clock 130 cycle has passed after FIG. 1A. The scan chains 102 are clocked by the clock signal 130 received from the SR control block 108. The clock 130 causes the scan chains 102 to serially progress bits 104 stored by the cells 106 of the scan chains 102 to adjacent subsequent cells 106, and in the direction of end cells 110, of respective scan chains 102. End cells 110 of scan chains 102 output their stored bits 104 to the SR control block 108, which stores the bits 104, in order, in a row of memory cells 118. Accordingly, in FIG. 1B, the end cell 110 bits 104 (i.e., 1100) from the previous FIG. 1A have been written into the row 114 number (1) of the memory 100. Further, bits 104 in each scan chain 102 have serially progressed by one cell 106 per scan chain 102. Serial progression of bits 104 (also called iterative progression of bits 104 or progressively moving bits 104 herein) means that if bits 104 are stored in serially-connected cells 106 of a scan chain, which for sake of reference consider in the orientation of FIG. 1C as left to right and for connection referred to as cells A, B, and C, then since cells 106 A, B, C are serially-connected A→B→C so that C is the end cell 110, then a single iterative progression will output the bit 104 stored in cell 106 C, cause the bit 104 stored in cell 106 B to be stored in cell 106 C, and cause the bit 104 stored in cell 106 A to be stored in cell 106 B. (Accordingly, the clock 130 is used as a propagation signal, that is, a signal to cause serial progression of bits 104 through a scan chain 102. In some embodiments, a propagation signal other than a clock 130 can be used.)

FIG. 1C shows an example block diagram 122 of the prior art circuit for using scan chains 102 to save a state of a design block, after two clock 130 cycles have passed after FIG. 1A. As shown in FIG. 1C, clock 130 cycles outputted by the SR control block 108 cause the scan chains 102 to iterate the serial progression of the bits 104 stored by the scan chains 102, and to sequentially output the contents of the scan chains 102 to the SR control block 108. Accordingly, in FIG. 1C, the end cell bits (i.e., 0001) from the previous FIG. 1B have been written into the row number (2) of the memory 112. Because bits 104 outputted from end cells 110 of scan chains 102 are stored in sequential rows of corresponding columns 116 of memory cells, the contents of the scan chains 102 are progressively reconstructed in the memory 112, albeit transposed from a scan chain 102 to a memory column 116.

FIG. 1D shows an example block diagram 124 of the prior art circuit for using scan chains 102 to save a state of a design block, after three clock 130 cycles have passed after FIG. 1A. As shown in FIG. 1E, because CHAIN 3 has only three cells 106, it has now outputted all three of its stored bits 104 and is empty.

FIG. 1E shows an example block diagram 126 of the prior art circuit for using scan chains 102 to save a state of a design block, after four clock 130 cycles have passed after FIG. 1A. As shown in FIG. 1E, because CHAIN 2 has only four cells 106, it has now outputted all four of its stored bits 104. Also, because CHAIN 3 was empty after FIG. 1D, there is no bit 104 for the SR control block 108 to store in the memory cell 118 located at row number (4), column (3) (also referred to in (row, column) convention as (4,3)) of the memory 112.

FIG. 1F shows an example block diagram 128 of the prior art circuit for using scan chains 102 to save a state of a design block, after five clock 130 cycles have passed after FIG. 1A. As shown in FIG. 1F, all of the scan chains 102 have now outputted all of their stored bits 104. Also, because CHAINS 2 and 3 were empty after FIG. 1D, there is no bit 104 for the SR control block 108 to store at memory cells 118 (5,2) and (5,3). This means that memory cells 118 (4,3), (5,2), and (5,3) were not assigned by the SR control block 108.

FIG. 1G shows a prior art example block diagram 132 of a memory 112 used to save a state of a design block. Typically, the memory 112 is treated as first-in-first-out (FIFO); this reflects connections already used for the state saving process. Also, as described with respect to the state saving process, the scan chains 102 are clocked together. Therefore, if the memory 112 state as shown in FIG. 1F is used to reload state data into the scan chains 102 by reading row-by-row from the top of the memory 112, data from shorter scan chains 102 (i.e., in columns (2) and (3)) will be iteratively progressed through and out of respective shorter scan chains 102, and unknown data (in the example as shown in FIG. 1F, the contents of (4,3), (5,2), and (5,3)) will be written into and remain in the shorter scan chains 102, causing an inaccurate reproduction of the data that was stored at the save part of the save-reset event. Therefore, the memory 112 is rearranged to prepare for restoration of the design block state. FIG. 1G shows the memory 112 before being rearranged 134 and after being rearranged 136. The memory cells 118 are rearranged so that the last bits 104 written from the shorter scan chains 102 are aligned with the last row 114 of memory cells 118 written by the SR control block 108 (the fifth row 114, because the longest scan chains 102 in FIGS. 1A through 1F are five cells 106 long). Also, the now-unassigned memory cells 118 at (1,2), (1,3) and (2,3) are filled with zeroes. These filler zeroes are first to be loaded into corresponding scan chains 102 (CHAINS 2 and 3, as the scan chain(s) 102 which are shorter than the longest scan chain(s) 102) during a state restoration process (see FIGS. 2A through 2F), and are discarded by shifting beyond the end cell 110 of the shorter chains 110 during the state restoration process. This will result in proper alignment of the state restoration data within the cells 106 of the scan chains 102 when a restore process completes. The memory 112 rearrangement shown in FIG. 1G typically requires software execution or specialized hardware to perform, and adds considerable time to the SR process.

Alternatively, in some prior art embodiments, additional flip-flops can be used to increase the length(s) of the shorter scan chain(s) 102 so that they are as long as the longest scan chain(s) 102, that is, such that each scan chain 102 has a same number of cells 106. This enables proper alignment of the state restoration data within the cells 106 of the scan chains 102 when a restore process completes without memory 112 rearrangement. However, additional flip flops can add significant additional device area usage, as well as additional leakage current when the design block is in a functional mode.

FIG. 2A shows an example block diagram 200 of a prior art circuit for using scan chains 102 to restore a saved state of a design block. A state restore process typically begins when an inactive design block is powered up from a sleep condition. As shown in FIG. 2A, at the beginning of the state restoration process, the memory 112 contains the same data in the same configuration as at the end of the state saving process as shown in FIG. 1G, after the saved data is rearranged 136. The memory 112 is connected to output data read out from a row 114 to the SR control block 108. The SR control block 108 is configured to output data received from the memory 112 to first cells 202 of respective scan chains 102, and to distribute the clock 130 to the scan chains 102. (In FIGS. 2A through 2F, a first cell 202 is intended to identify the cell farthest to the left in each respective scan chain 102.) The clock 130 causes the data received by each of the scan chains 102 from the SR control block 108 to be stored in corresponding cells 106 for each receiving scan chain 102, and for bits 104 (not shown in FIG. 2A) to be iteratively progressed through the serially connected cells 106 of respective scan chains 102. In FIGS. 2B through 2F, the arrow from the memory 112 to the SR control block 108 indicates the row 114 that has just been unloaded from the memory 112 to reload respective cells 106 in each of the scan chains 102.

FIG. 2B shows an example block diagram 202 of the prior art circuit for using scan chains 102 to restore a saved state of a design block, after one clock 130 cycle has passed since FIG. 2A. The clock 130 cycle causes data stored in a first row 114 (row 1) of the memory 112 to be read out from the memory 112 and stored in cells 106 in corresponding ones of the scan chains 102. Accordingly, columns 116 in the memory 112 correspond to respective scan chains 102, so that data read out from memory cells 118 in column 1 are stored in CHAIN 1, data read out from memory cells 118 in column 2 are stored in CHAIN 2, and so on. This means that data are returned to the scan chain 102 they were previously read out from in the save process described with respect to FIGS. 1A through 1G. Note that the zeroes moved into the second and third scan chains 102 (CHAINS 2 and 3) are filler that was added in during the memory 112 rearrangement shown in and described with respect to FIG. 1G. These zeroes will be discarded (i.e., shifted out of a respective scan chain 102) later in the restore process, as described below.

FIG. 2C shows an example block diagram 204 of the prior art circuit for using scan chains 102 to restore a state of a design block, after two clock 130 cycles have passed since FIG. 2A. The clock 130 cycle causes the bits 104 stored in each of the scan chains 102 to be moved through the serially-connected cells 106 in the scan chains 102, and data stored in each of the columns a second row 114 of memory cells 118 to be read out from the memory 112 and stored in corresponding scan chains 102.

FIG. 2D shows an example block diagram 206 of the prior art circuit for using scan chains 102 to restore a saved state of a design block, after three clock 130 cycles have passed since FIG. 2A. The clock 130 cycle causes the bits 104 stored in the scan chains 102 to be moved through the serially-connected cells 106 in the scan chains 102, and data stored in a third row 114 of memory cells 118 to be read out from the memory 112 and stored in corresponding scan chains 102.

FIG. 2E shows an example block diagram 208 of the prior art circuit for using scan chains 102 to restore a saved state of a design block, after a fourth clock 130 cycle has passed since FIG. 2A. The clock 130 cycle causes the bits 104 stored in the scan chains 102 to be moved through the serially-connected cells 106 in the scan chains 102, and data stored in a fourth row 114 of memory cells 118 to be read out from the memory 112 and stored in corresponding scan chains 102. Because the third scan chain 102 (CHAIN 3) is only three cells 106 long, one of the filler zeroes is clocked out of CHAIN 3 and thereby discarded.

FIG. 2F shows an example block diagram 210 of the prior art circuit for using scan chains 102 to restore a saved state of a design block, after a fifth clock 130 cycle has passed since FIG. 2A. The clock 130 cycle causes the bits 104 stored in the scan chains 102 to be moved through the serially-connected cells 106 in the scan chains 102, and data stored in a fifth row 114 of memory cells 118 to be read out from the memory 112 and stored in corresponding scan chains 102. Because the second and third scan chains 102 (CHAINS 2 and 3) are less than five cells 106 long (the length of the longest scan chains 102, the first and fourth scan chains 102), a filler zero is clocked out of each of CHAINS 2 and 3 and thereby discarded. As shown in FIG. 2F, the scan chains 102 now contain the same bits 104, in the same configuration, as at the start of the save process in FIG. 1A. The data contained in the scan chains 102 can then be used to restore the saved state of the design block, reversing the process used to initially load the state data of the design block into the scan chains 102.

SUMMARY

In described examples, circuitry for saving and restoring a design block state includes first memories configured to receive, and store in different first memories in a first order, different portions of first data; and a second memory coupled to first memories. First memories with the most memory cells have N memory cells. First memories with fewer memory cells have M memory cells. When saving state, first data from different first memories is written in a second order to different corresponding regions of the second memory as second data. The second order repeats portions of the first data stored in sequentially first N mod M cells, determined using the first order, of corresponding first memories with fewer cells. When restoring state, second data is read from the second memory and stored, in the first order, in corresponding first memories; repeated portions are repeatedly stored in corresponding first memories with fewer cells.

BRIEF DESCRIPTION OF THE DRAWINGS

FIG. 6B shows an example timing diagram for the clock circuit.

DETAILED DESCRIPTION

Figure 1A:
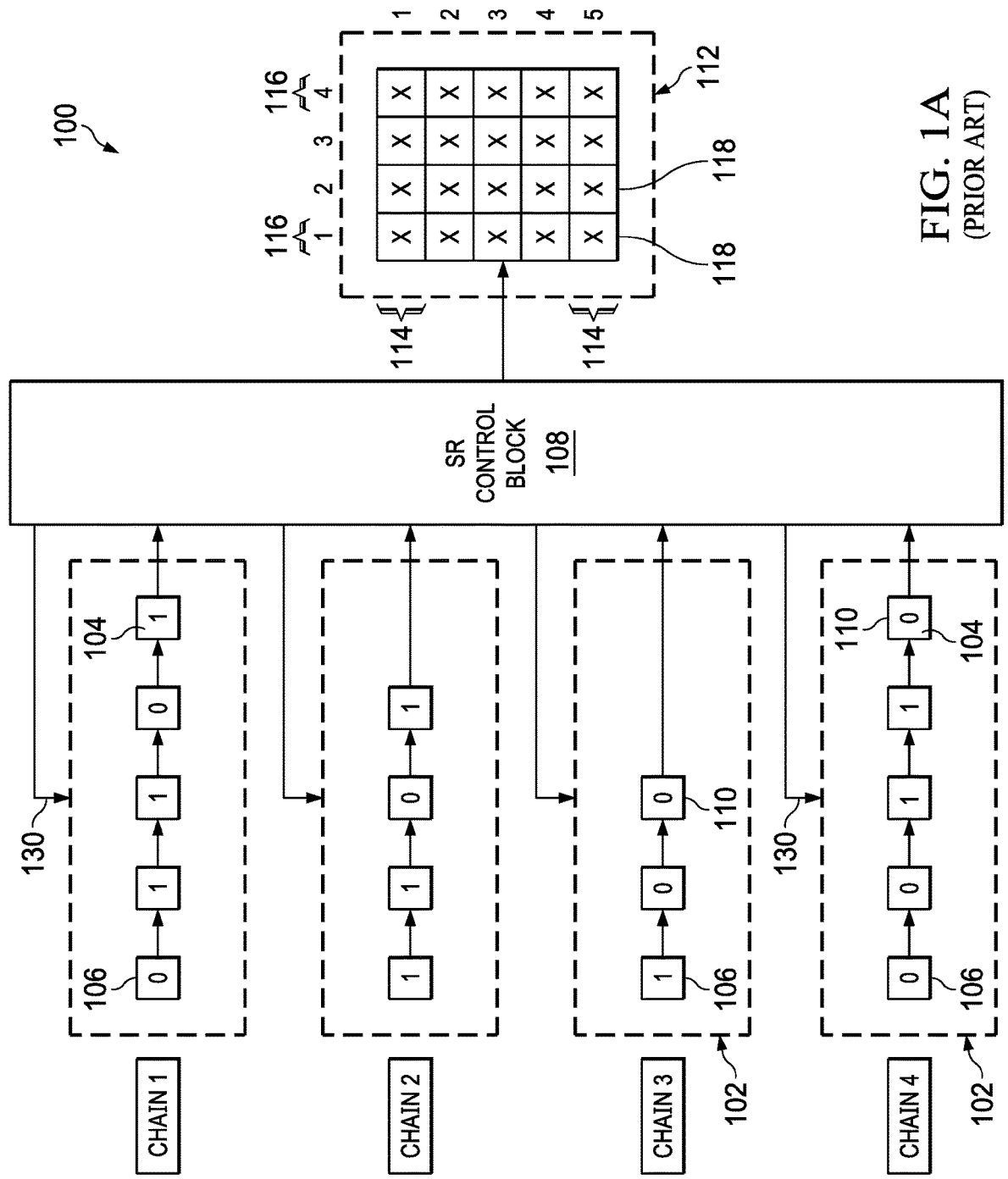
FIG. 1A shows an example block diagram of a prior art circuit for using scan chains to save a state of a design block.
Figure 1B:
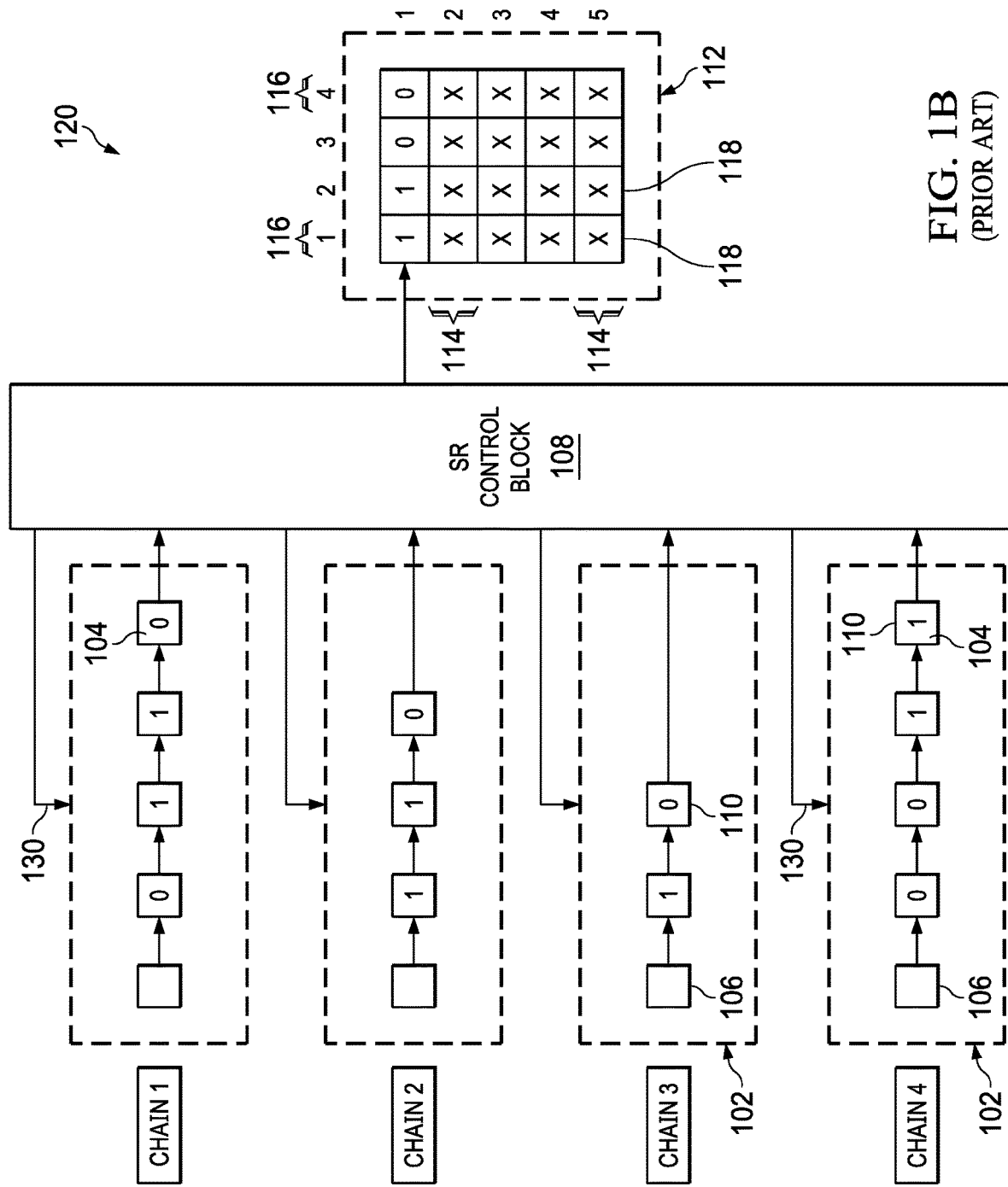
FIG. 1B shows an example block diagram of a prior art circuit for using scan chains to save a state of a design block, after one clock cycle has passed after FIG. 1A.
Figure 1C:
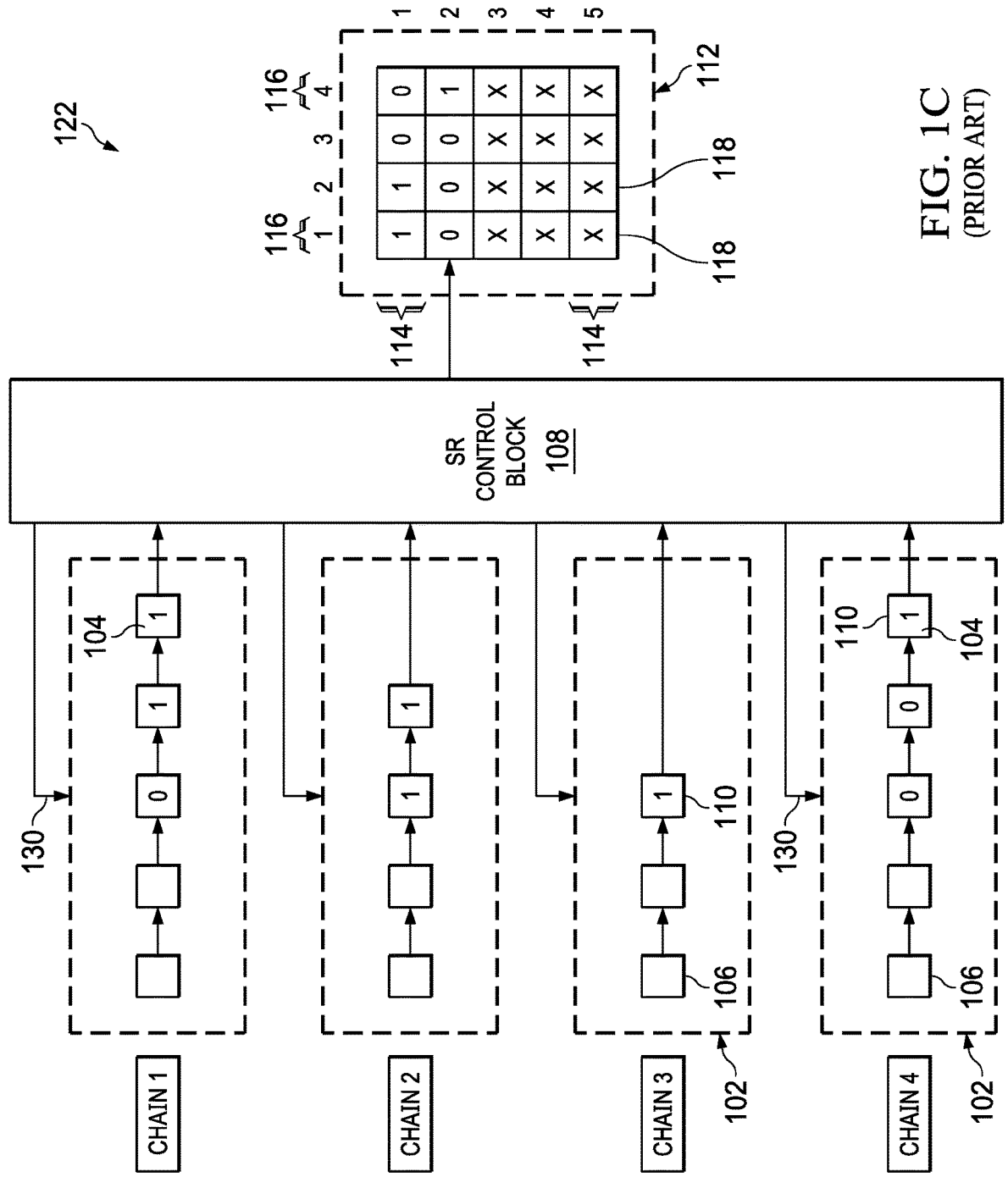
FIG. 1C shows an example block diagram of the prior art circuit for using scan chains to save a state of a design block, after two clock cycles have passed after FIG. 1A.
Figure 1D:
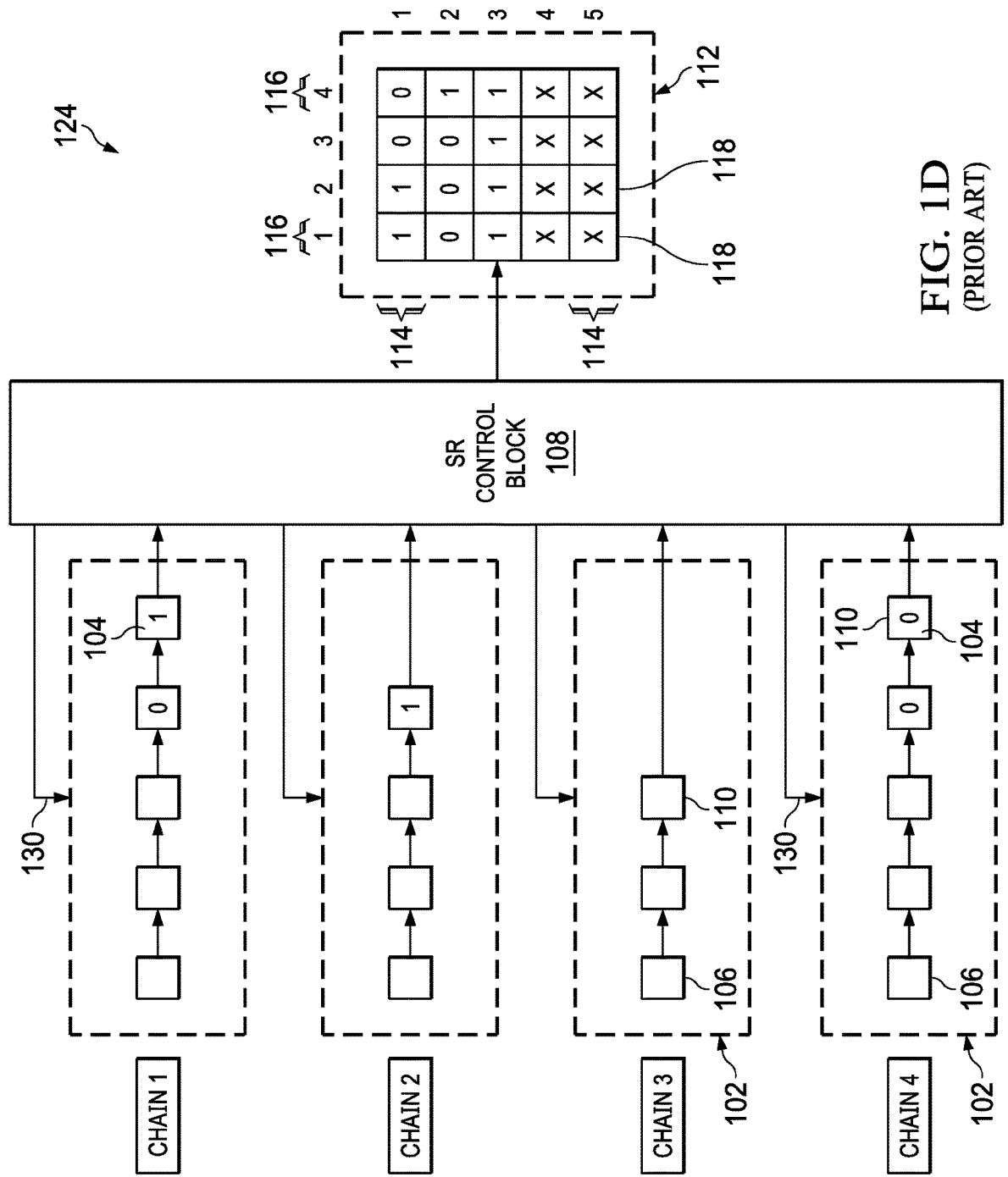
FIG. 1D shows an example block diagram of the prior art circuit for using scan chains to save a state of a design block, after three clock cycles have passed after FIG. 1A.
Figure 1E:
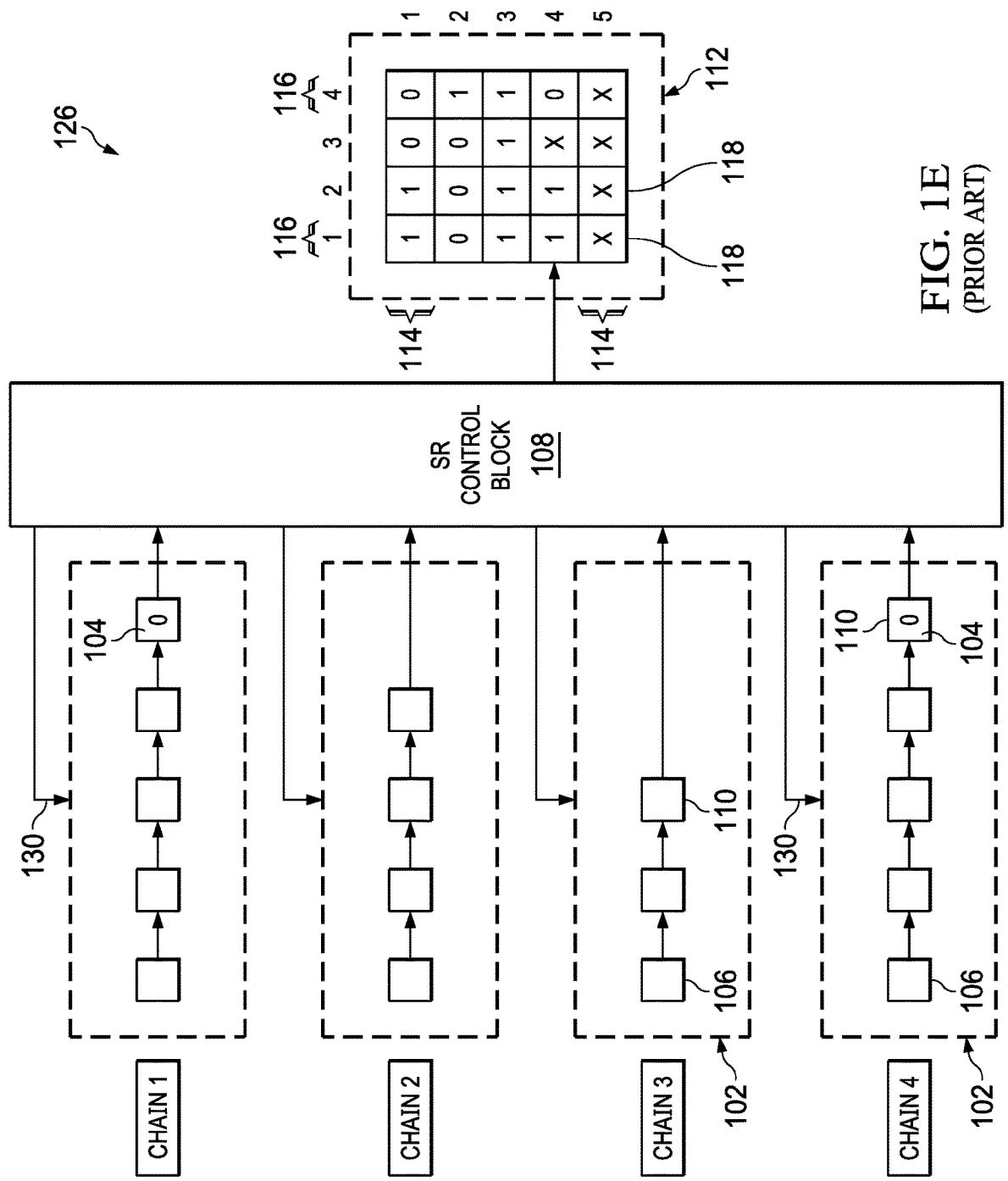
FIG. 1E shows an example block diagram of the prior art circuit for using scan chains to save a state of a design block, after four clock cycles have passed after FIG. 1A.
Figure 1F:
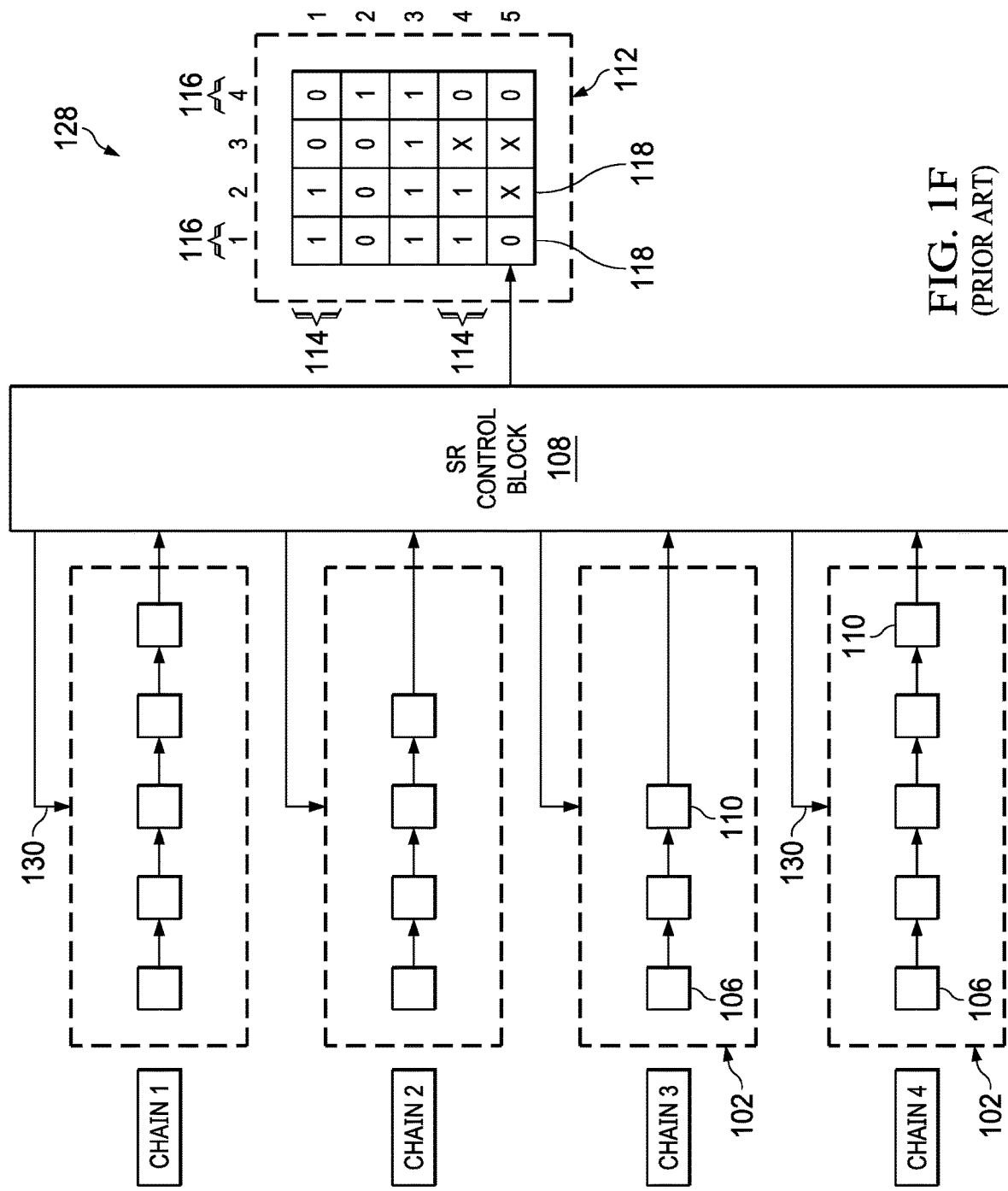
FIG. 1F shows an example block diagram of the prior art circuit for using scan chains to save a state of a design block, after five clock cycles have passed after FIG. 1A.
Figure 1G:
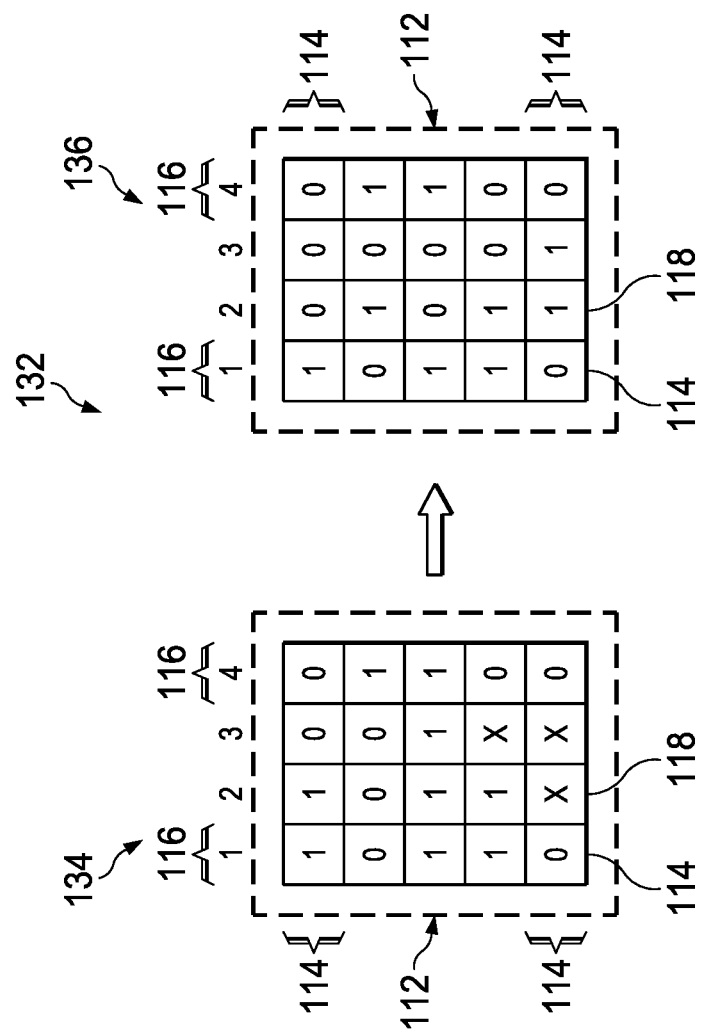
FIG. 1G shows a prior art example block diagram of a memory used to save a state of a design block.
Figure 2A:
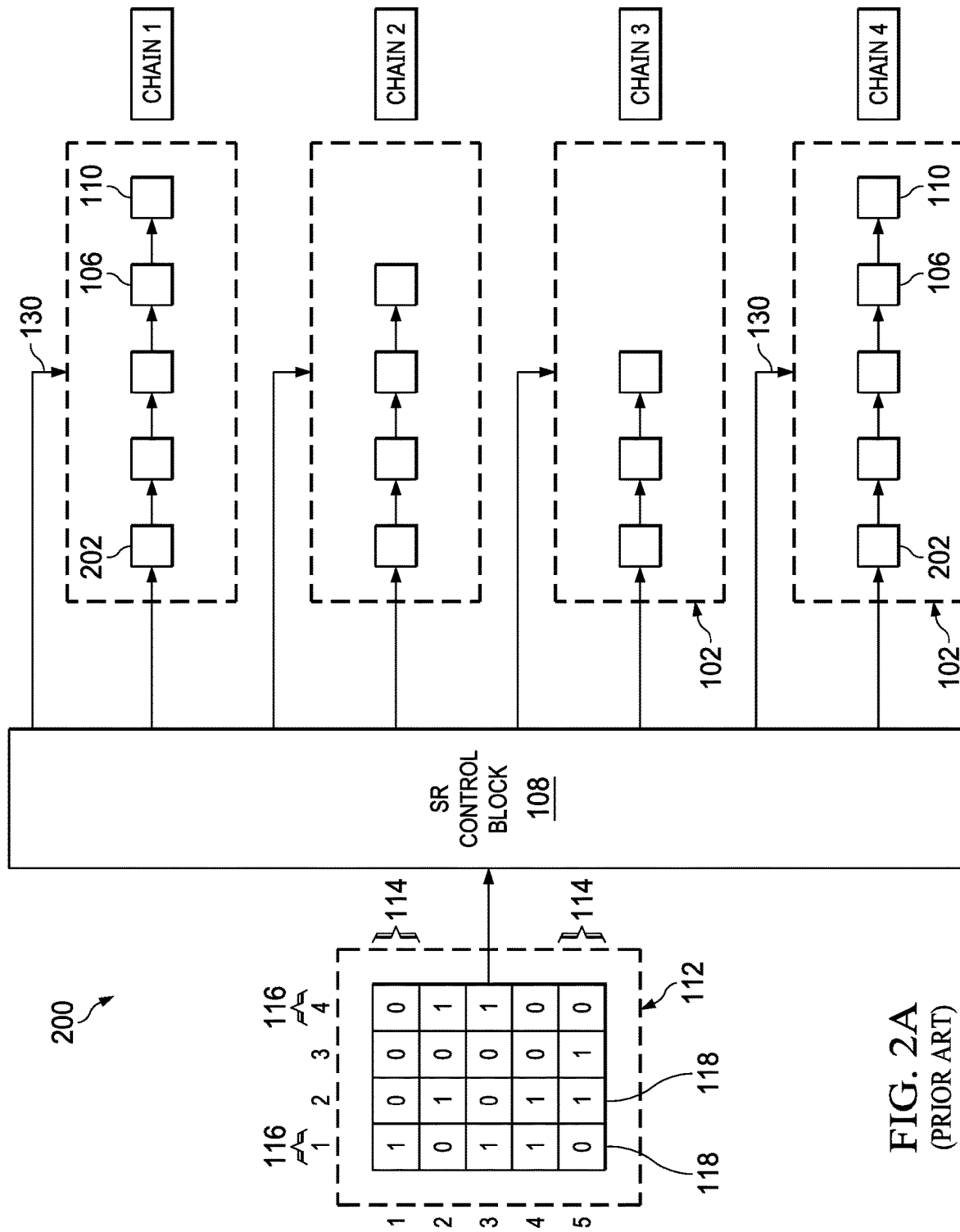
FIG. 2A shows an example block diagram of a prior art circuit for using scan chains to restore a saved state of a design block.
Figure 2B:
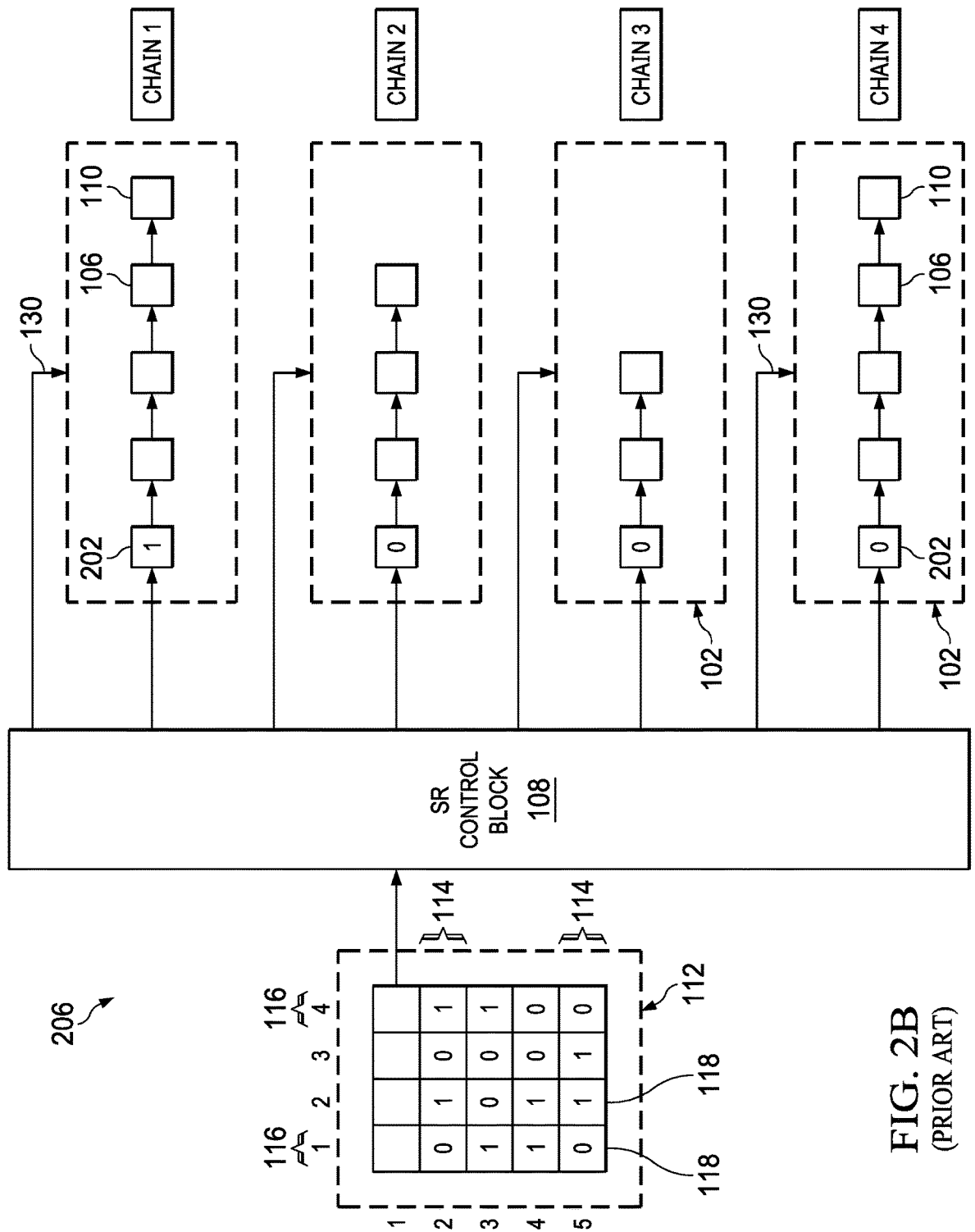
FIG. 2B shows an example block diagram of the prior art circuit for using scan chains to restore a saved state of a design block, after one clock cycle has passed since FIG. 2A.
Figure 2C:
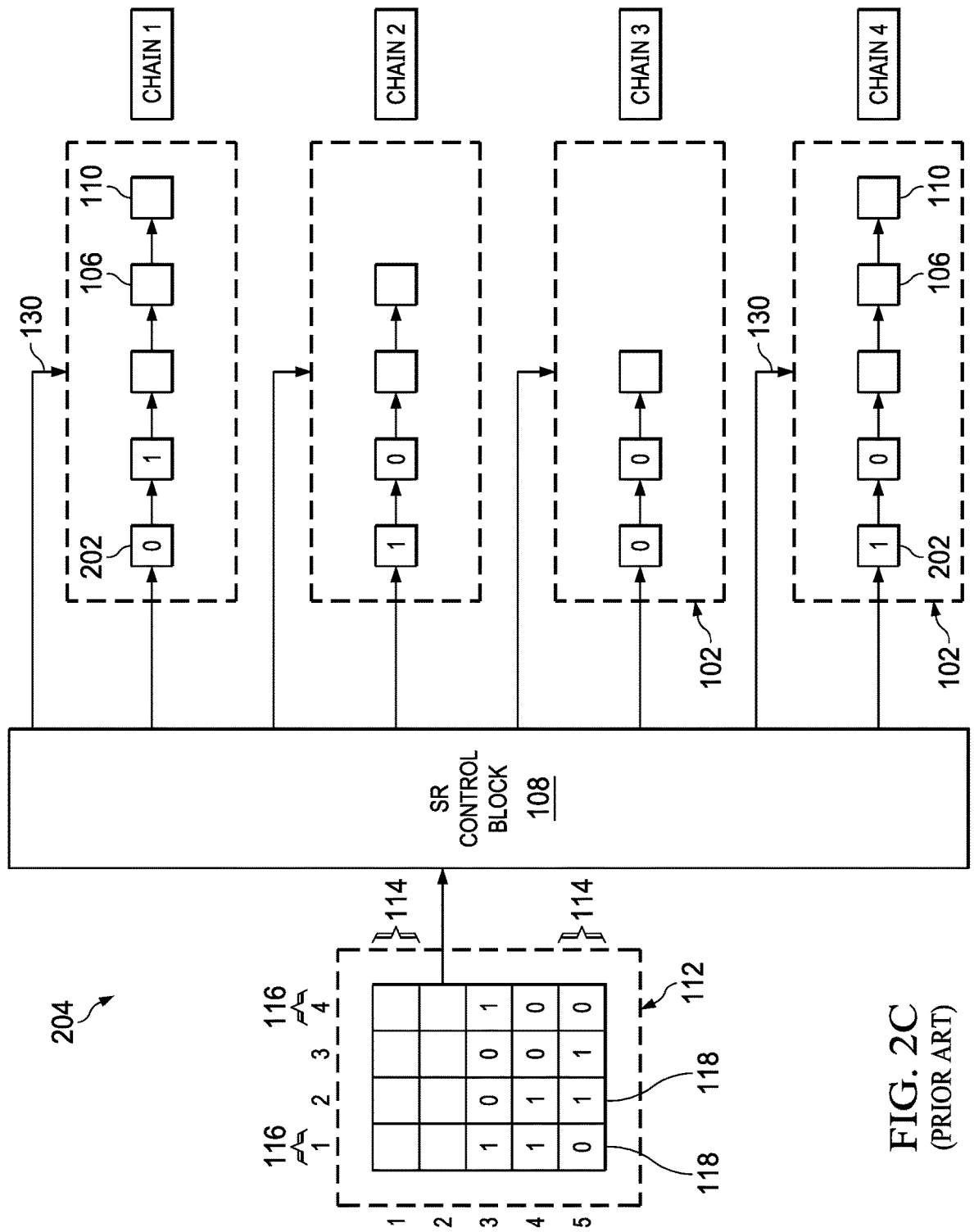
FIG. 2C shows an example block diagram of the prior art circuit for using scan chains to restore a state of a design block, after two clock cycles have passed since FIG. 2A.
Figure 2D:
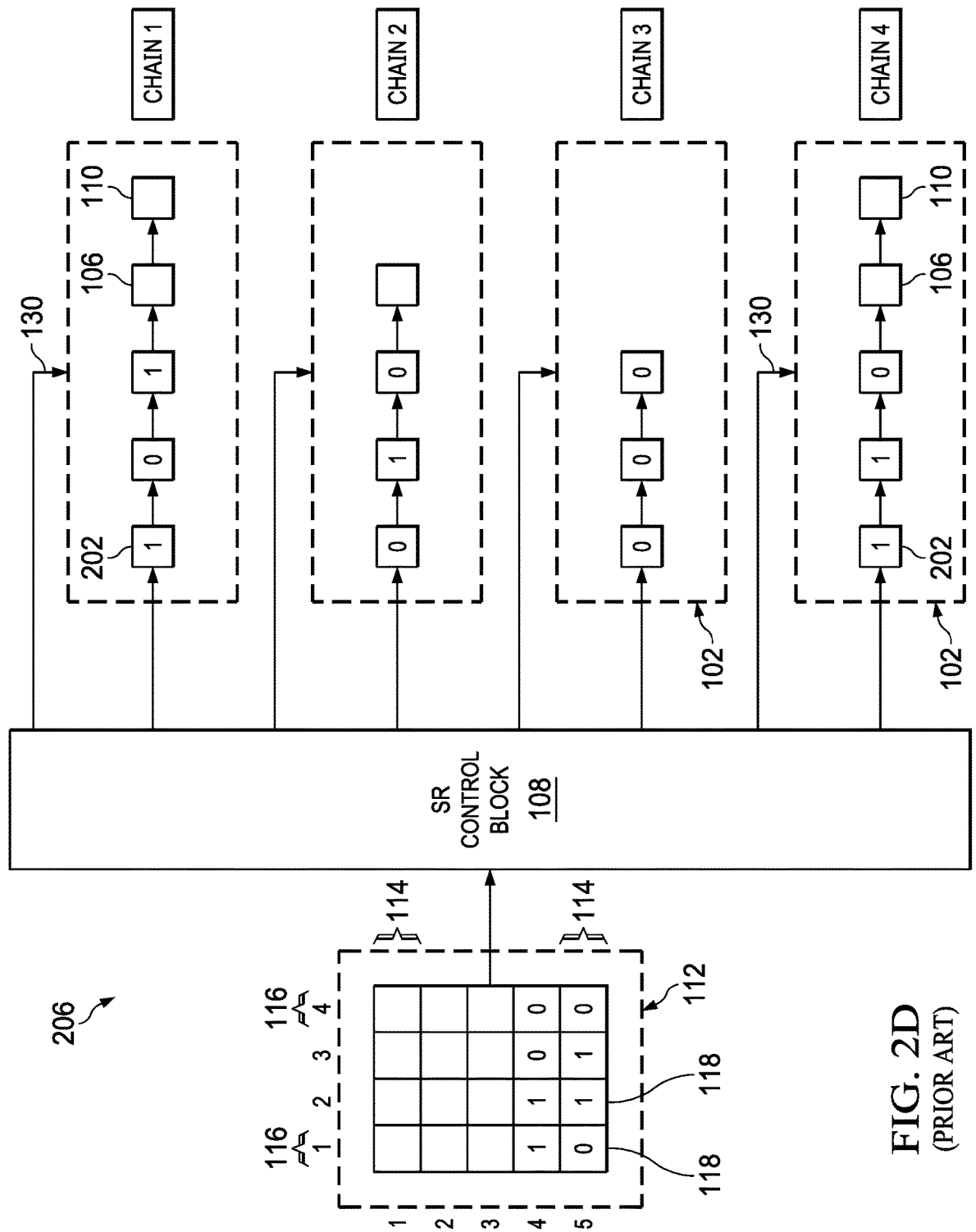
FIG. 2D shows an example block diagram of the prior art circuit for using scan chains to restore a saved state of a design block, after three clock cycles have passed since FIG. 2A.
Figure 2E:
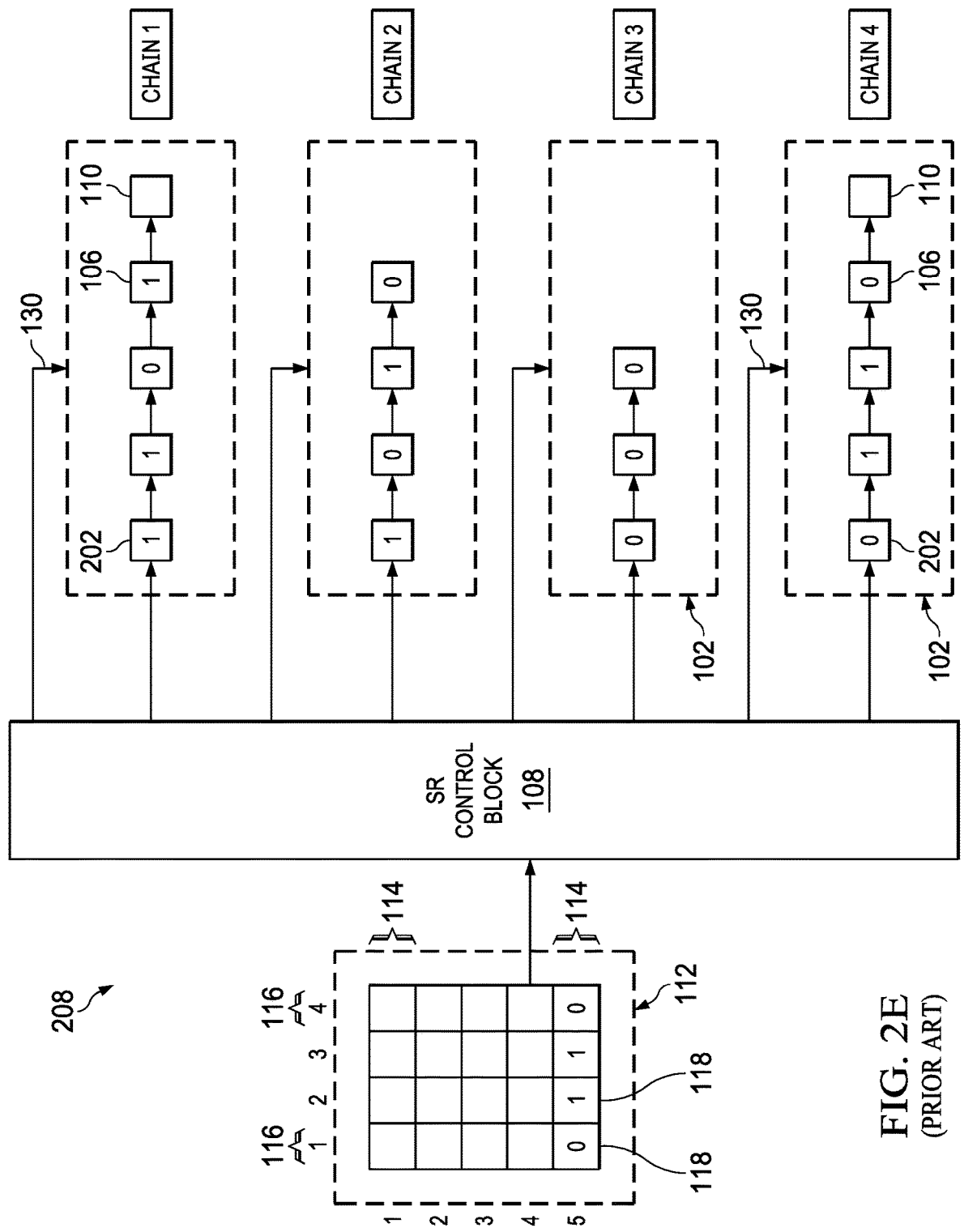
FIG. 2E shows an example block diagram of the prior art circuit for using scan chains to restore a saved state of a design block, after a fourth clock cycle has passed since FIG. 2A.
Figure 2F:
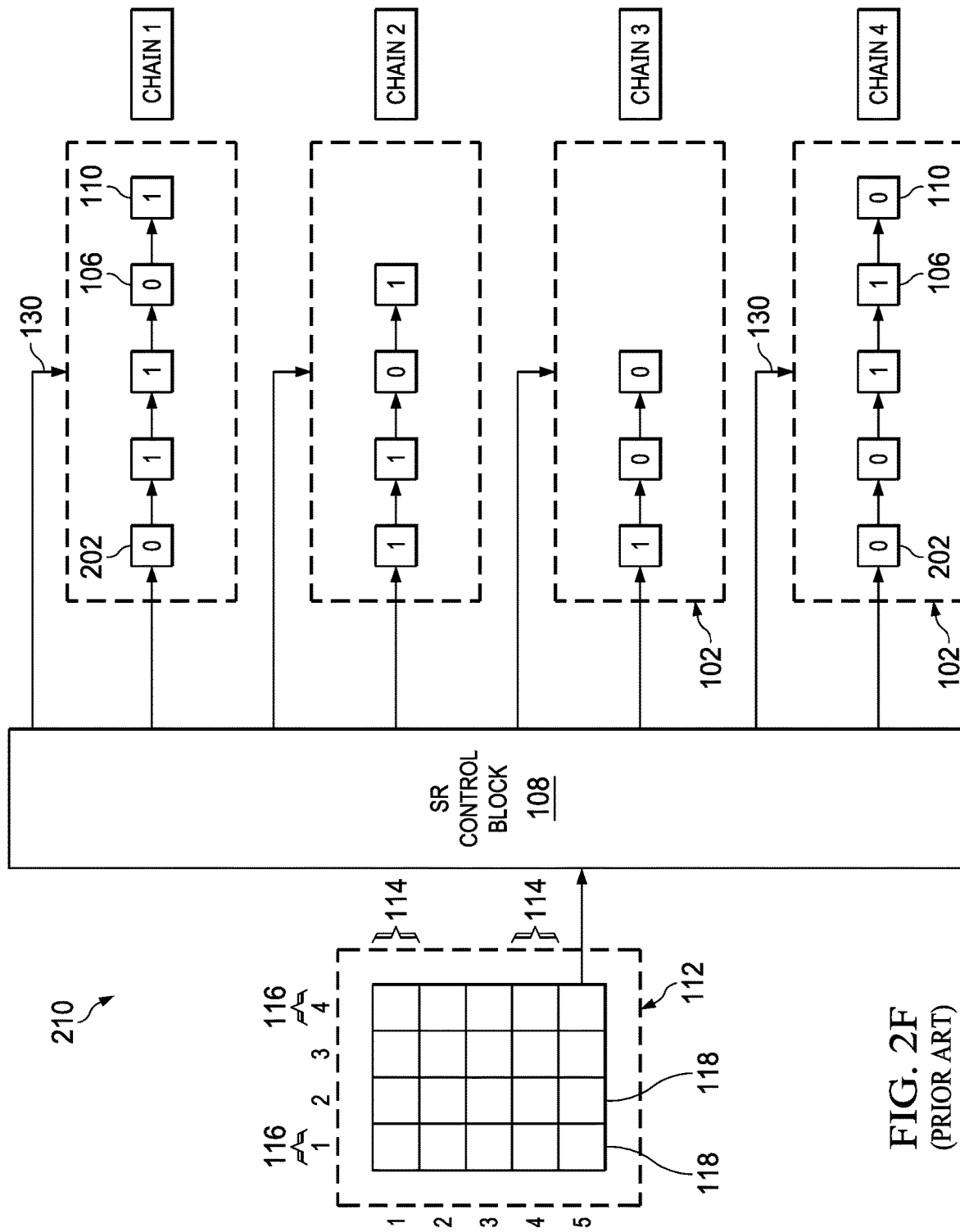
FIG. 2F shows an example block diagram of the prior art circuit for using scan chains to restore a saved state of a design block, after a fifth clock cycle has passed since FIG. 2A.
Figure 3A:
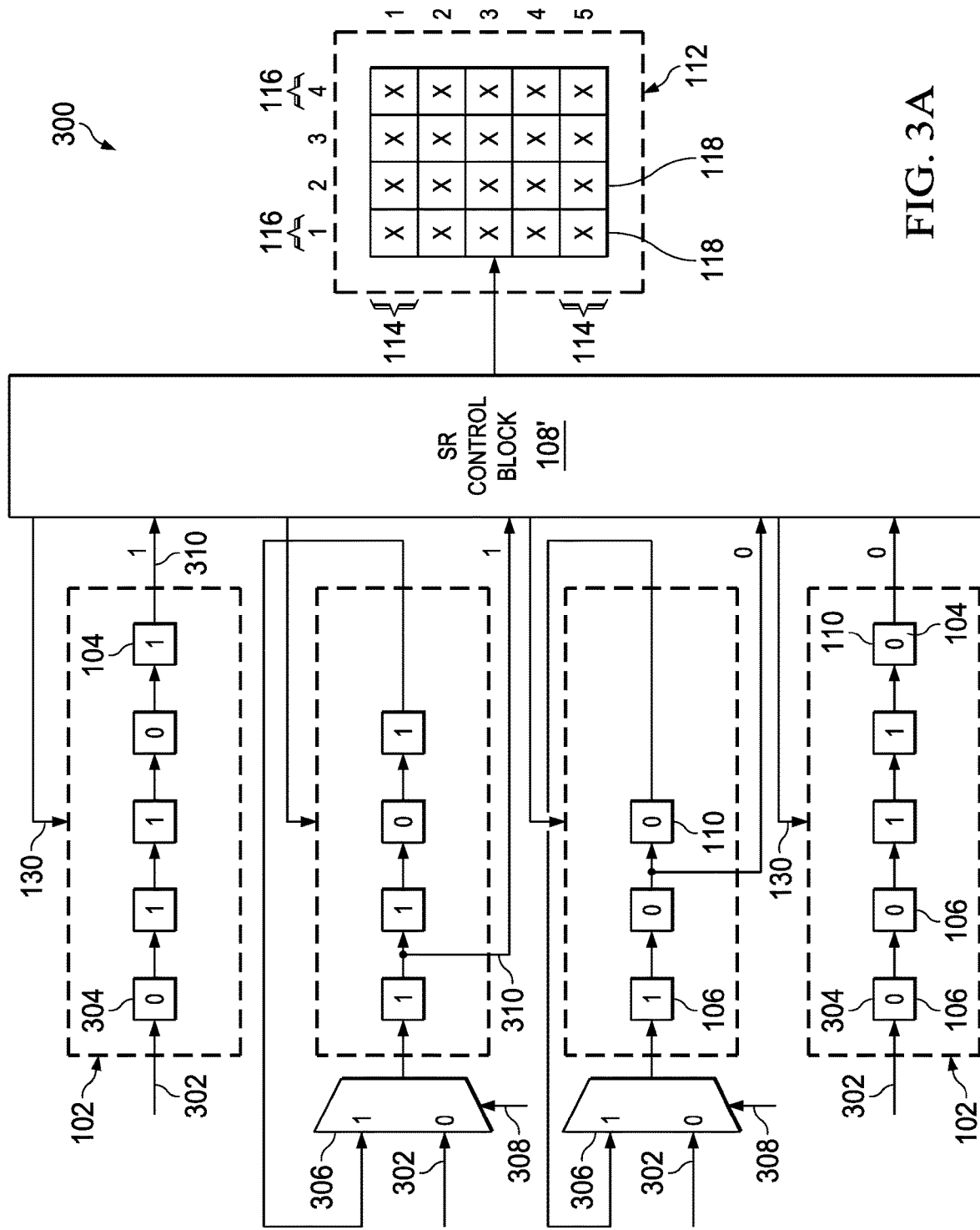
FIG. 3A shows an example block diagram of a circuit for using scan chains to save a state of a design block.

FIG. 3A shows an example block diagram 300 of a circuit for using scan chains 102 to save a state of a design block. The circuits 300, 312, 314, 316, 318, 320 of FIGS. 3A through 3F, respectively, share various aspects with the circuits 100, 120, 122, 124, 126, 128 of FIGS. 1A through 1F, so like reference numbers from FIGS. 1A through 1F are carried forth into FIGS. 3A through 3F for such items. The shorter scan chains 102 in circuits 300, 312, 314, 316, 318, 320 of FIGS. 3A through 3F do not include connections between end cells 110 and the SR control block 108, while the longer scan chains 102 in circuits 300, 312, 314, 316, 318, 320 of FIGS. 3A through 3F do include connections between end cells 110 and the SR control block 108' (the SR control block 108' shown in and described with respect to FIGS. 3A through 4F has some similarities to the SR control block 108 of prior art FIGS. 1A through 1F and 2A through 2F, but also introduces additional functionality, as described with respect to the inventive subject matter introduced herein).

Typically, a state saving process will be performed when a design block receives a sleep command and prepares to power down. Design block state data is initially loaded from design block memory elements (not shown) into respective scan chains 102 using state data inputs 302 (this process is not shown), resulting in scan chains 102 loaded with state data as shown in FIG. 3A. The longest scan chains 102 shown in FIG. 3A are five cells 106 long. In the longest scan chains 102, the state data input 302 connects directly to a first cell 304 (furthest, in terms of number of serially-connected scan path cells 106, from the SR control block 108') of the scan chain 102. In shorter scan chains 102, the state data input 302 connects to a first input of a multiplexer 306. The multiplexer 306 also receives as a second input the output of the end cell 110 of the respective scan chain 102. An SR mode selector 308 provides a control signal to each multiplexer 306 so as to control which of the multiplexer's respective inputs is outputted into the first cell 304 of the respective scan chain 102. The SR mode selector 308 will select the output of the end cell 110 when the scan chain 102 is performing a save process as shown in FIGS. 3A through 3F. The SR mode selector 308 will select the data received from the state data input 302 when the scan chain 102 is performing a restore process as shown in (and further described below with respect to) FIGS. 4A through 4F.

Each scan chain 102 also comprises an SR output 310, which outputs data from a selected cell 106 of the respective scan chain 102 to the SR control block 108' for storage in the memory 112. In the longest scan chains 102, the selected cell 106 providing the SR output 310 is the end cell 110. In shorter scan chains 102, the selected cell 106 providing the SR output 310 is a cell 106 other than the respective scan chain's 102 end cell 110. For longest scan chains 102 of length N, and a shorter scan chain 102 of length M, where the first cell 106 of the shorter scan chain 102 is numbered one (1), and subsequent cells 106 of the shorter scan chain 102 are serially numbered up to the end cell 110, which is numbered M: the SR output 310 is connected to the (N–M) cell, so that when progression of bits 104 through the serially-connected cells 106 of the scan chain 102 is triggered by the clock 130, the bit 104 in the (N–M) cell 106 is outputted to the SR control block 108' for storage in the memory 112 and is also progressed to the next cell 106 (numbered N–M+1). (For convenience, scan chains 102 are referred to as being numbered from the top scan chain 102, CHAIN 1, to the bottom scan chain 102, CHAIN 4.) As shown in FIG. 3A, CHAINS 1 and 4 both have a same largest number of cells, with a length of five cells 106 long, while CHAIN 2 is four cells 106 long, and CHAIN 3 is three cells 106 long. Therefore, the SR output 310 of CHAIN 2 is connected to the output of cell 106 one (N–M=5–4=1), and the SR output 310 of CHAIN 3 is connected to the output of cell 106 two (N–M=5–3=2).

Consideration of the case where N–M≥M leads to a generalization of this design. Accordingly, the SR output 310 should be connected to cell 106 N mod M to produce the results described herein. Note that cell 106 N mod M is the same as cell 106 N–M when N–M<M.

In FIGS. 3A through 3E, the values of the bits 104 which will be outputted by the respective scan chains 102 as a result of the next clock 130 cycle are shown, for clarity, where the respective SR outputs 310 connect to the SR control block 108'. CHAIN 1 will output a 1 from the end cell 110 of CHAIN 1; CHAIN 2 will output a 1 from cell 106 one of CHAIN 2; CHAIN 3 will output a 0 from cell 106 two of CHAIN 3; and CHAIN 4 will output a 0 from the end cell 110 of CHAIN 4.

Figure 3B:
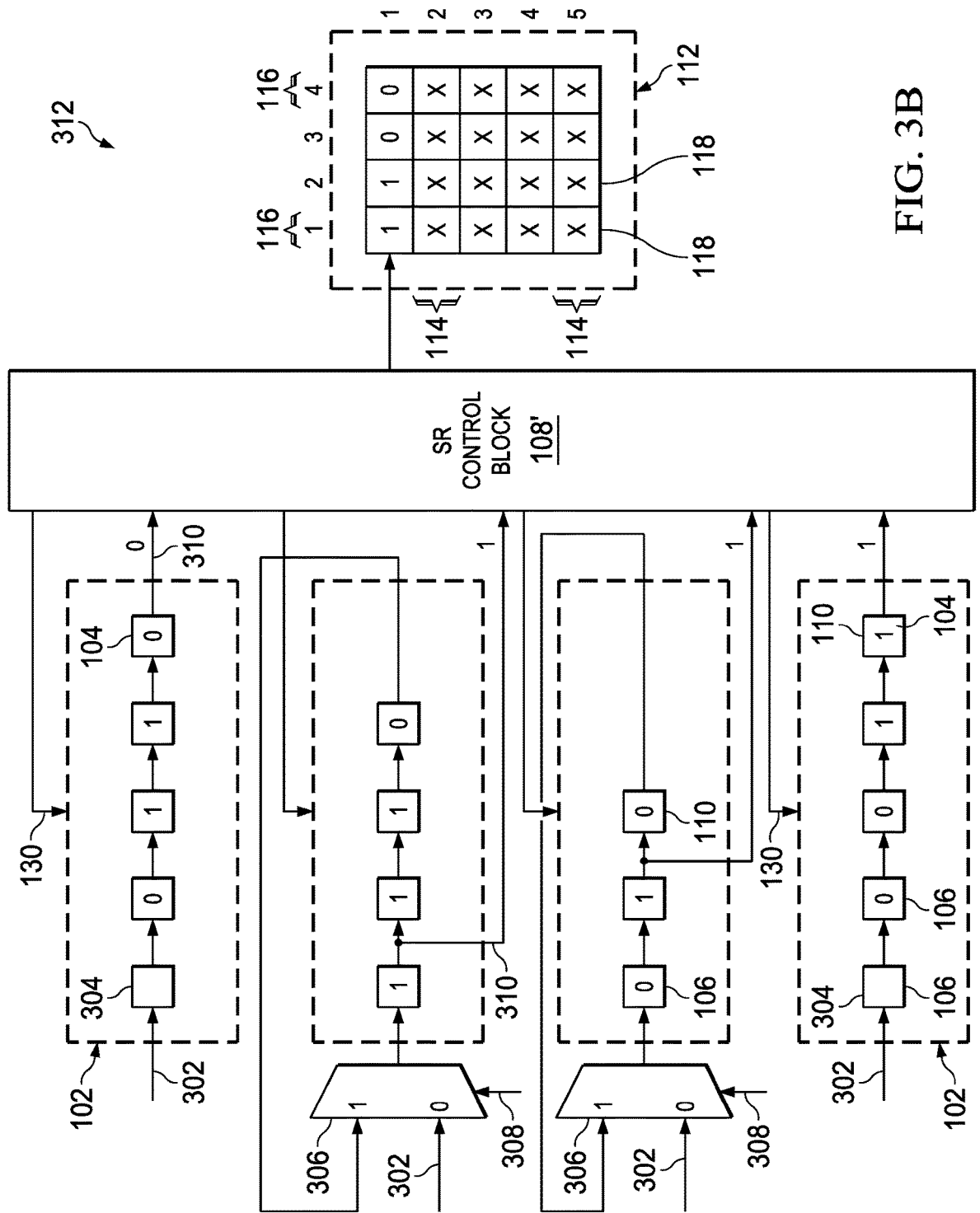
FIG. 3B shows an example block diagram of the circuit for using scan chains to save a state of a design block, after one clock cycle has passed since FIG. 3A.

FIG. 3B shows an example block diagram 312 of a circuit for using scan chains 102 to save a state of a design block, after one clock 130 cycle has passed since FIG. 3A. In FIGS. 3B through 3F, the arrow from the SR control block 108' to the memory 112 indicates in which row 114 of the memory 112 the SR control block 108' caused data outputted from the scan chains 102 to be saved on the most recent clock 130 cycle. In FIG. 3B, data outputted from the scan chains 102 as a result of the most recent clock 130 cycle has been stored in row 1 of the memory 112. Contemporaneously (preferably, during the same clock 130 cycle), the SR control block 108' reads a bit 104 value from each respective scan chain 102, as follows. CHAIN 1 will output a 0 from the end cell 110 of CHAIN 1; CHAIN 2 will output a 1 from cell 106 one of CHAIN 2; CHAIN 3 will output a 1 from cell 106 two of CHAIN 3; and CHAIN 4 will output a 1 from the end cell 110 of CHAIN 4.

As shown in FIG. 3B, bits 104 have progressed serially through the cells 106 of each scan chain 102. As a result, the bits 104 that were previously stored in the end cells 110 of chains 1 and 4 (the longest scan chains 102) are no longer stored by the respective scan chains 102. However, in chains 2 and 3 (the shorter scan chains 102), the bits 104 stored in the respective end cells 110 looped back to the respective multiplexers 306, and were passed by the multiplexers 306 (as selected by the SR mode selector 308) to and stored in the respective first cells 304. This means that data will cycle through shorter scan chains 102, so that some bits stored in shorter scan chains 102 will be outputted to the SR control block 108' and stored in the memory 112 more than once during the number of clock 130 cycles (i.e., N clock 130 cycles) that are required to fully output the data from the longest chain(s) 102.

Figure 3C:
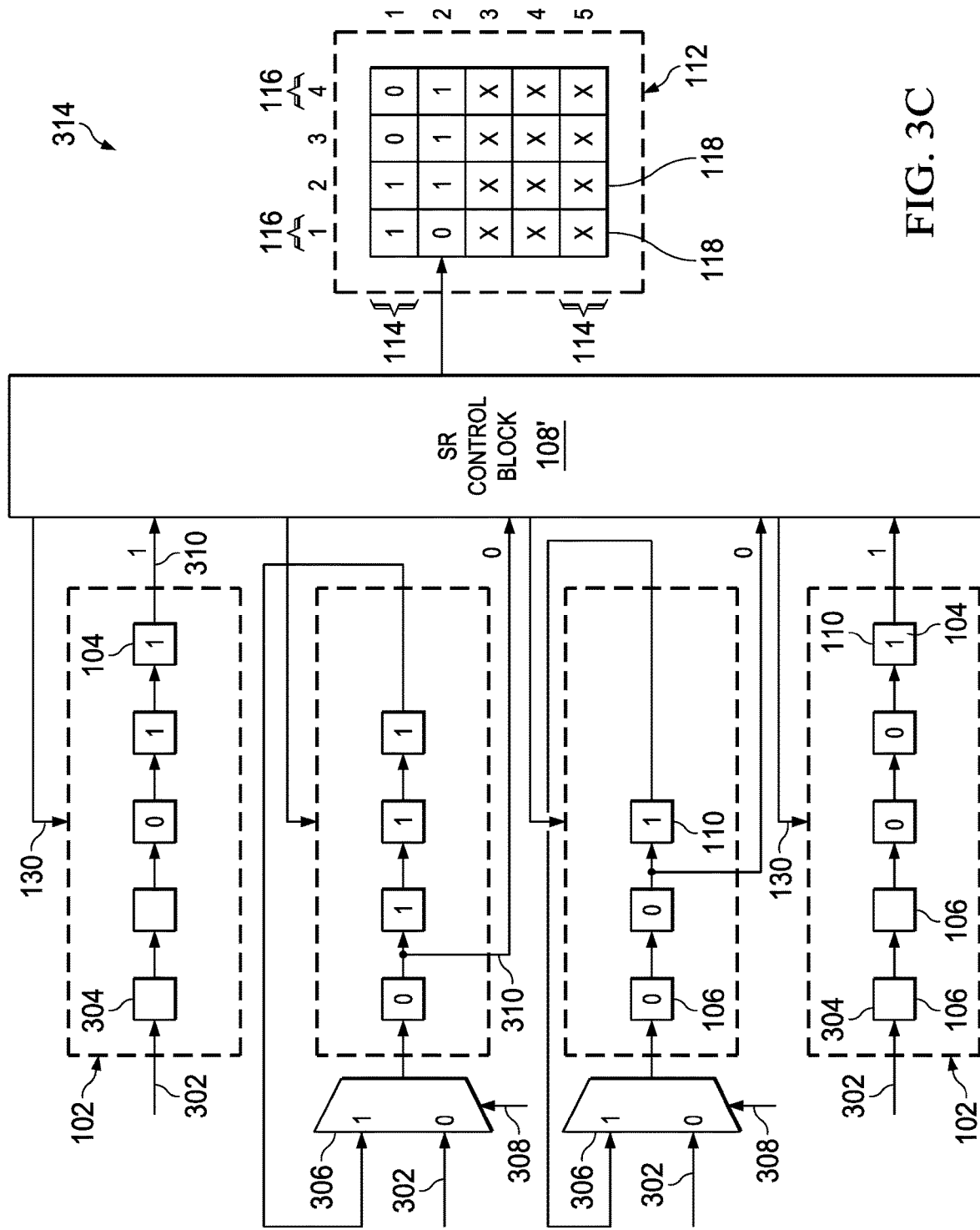
FIG. 3C shows an example block diagram of the circuit for using scan chains to save a state of a design block, after two clock cycles have passed since FIG. 3A.

FIG. 3C shows an example block diagram 314 of a circuit for using scan chains 102 to save a state of a design block, after two clock 130 cycles have passed since FIG. 3A. Data outputted from the scan chains 102 as a result of the most recent clock 130 cycle has been stored in row 2 of the memory 112. Meanwhile, the values of the bits 104 which will be outputted by the respective scan chains 102 as a result of the next clock 130 cycle are: CHAIN 1 will output a 1 from the end cell 110 of CHAIN 1; CHAIN 2 will output a 0 from cell 106 one of CHAIN 2; CHAIN 3 will output a 0 from cell 106 two of CHAIN 3; and CHAIN 4 will output a 1 from the end cell 110 of CHAIN 4. Also, the 0 which was stored in the end cell 110 of CHAIN 2 from the immediately-preceding cycle has looped back to and been stored in the first cell 304 of CHAIN 2, and the 0 which was stored in the end cell 110 of CHAIN 3 from the immediately-preceding cycle has looped back to and been stored in the first cell 304 of CHAIN 3 (via respective multiplexers 306).

Figure 3D:
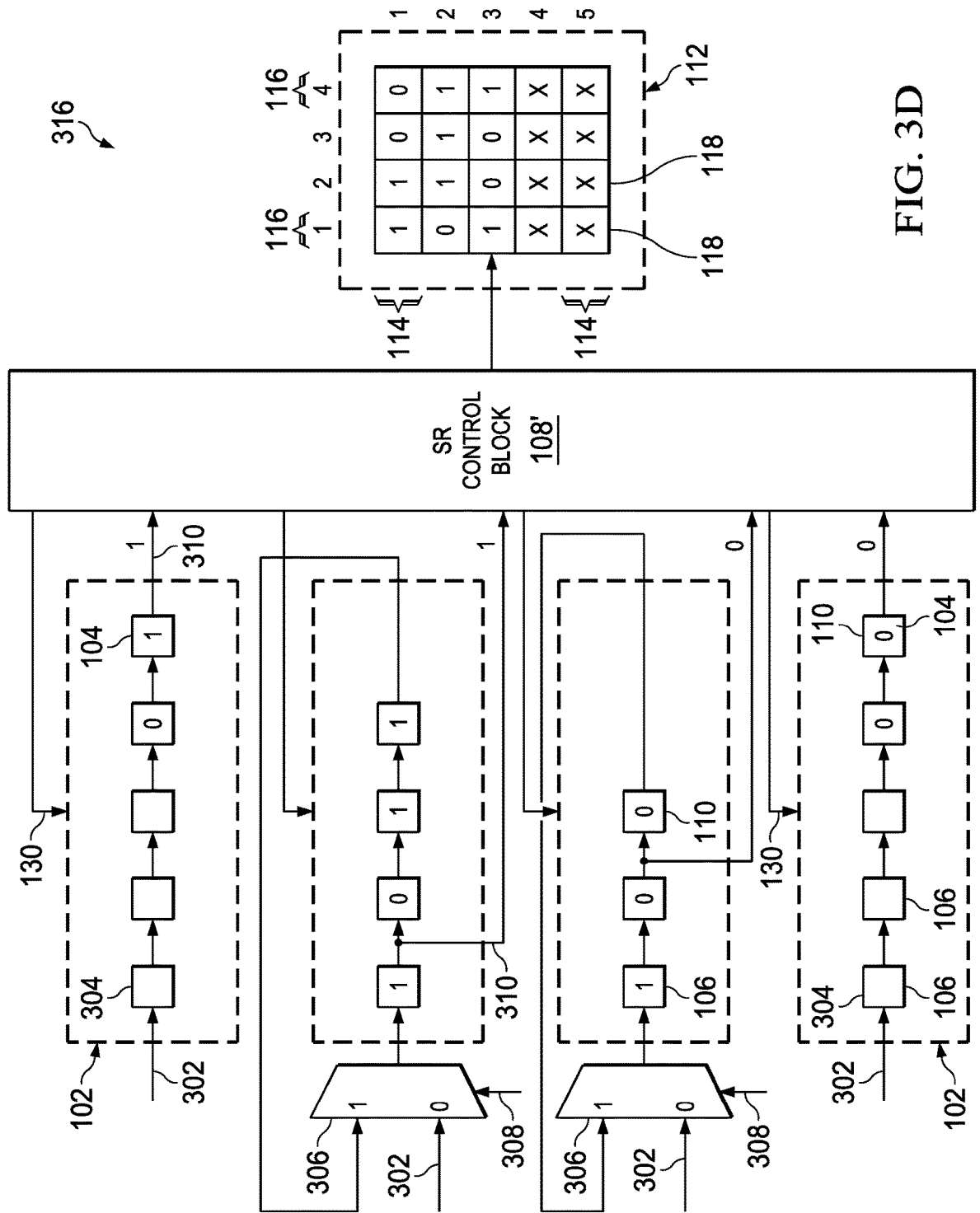
FIG. 3D shows an example block diagram of the circuit for using scan chains to save a state of a design block, after three clock cycles have passed since FIG. 3A.

FIG. 3D shows an example block diagram 316 of a circuit for using scan chains 102 to save a state of a design block, after three clock 130 cycles have passed since FIG. 3A. Data outputted from the scan chains 102 as a result of the most recent clock 130 cycle has been stored in row 3 of the memory 112. The values of the bits 104 which will be outputted by the respective scan chains 102 as a result of the next clock 130 cycle are: CHAIN 1 will output a 1 from the end cell 110 of CHAIN 1; CHAIN 2 will output a 1 from cell 106 one of CHAIN 2; chain 3 will output a 0 from cell 106 two of CHAIN 3; and CHAIN 4 will output a 0 from the end cell 110 of CHAIN 4. Also, the 1 which was stored in the end cell 110 of CHAIN 2 from the immediately-preceding cycle has looped back to and been stored in the first cell 304 of CHAIN 2, and the 1 which was stored in the end cell 110 of CHAIN 3 from the immediately-preceding cycle has looped back to and been stored in the first cell 304 of CHAIN 3 (via respective multiplexers 306). Note that, three clock 130 cycles after FIG. 3D, CHAIN 3 has returned to the arrangement of bit 104 values stored in cells 106 shown in FIG. 3A. This is because M (the length in cells 106 of the scan chain 102) equals three (three cells 106, three clock 130 cycles) for CHAIN 3. This means that the sequence of data outputted by CHAIN 3, and stored by the memory 112, will begin to repeat for the remainder of the state saving process.

Figure 3E:
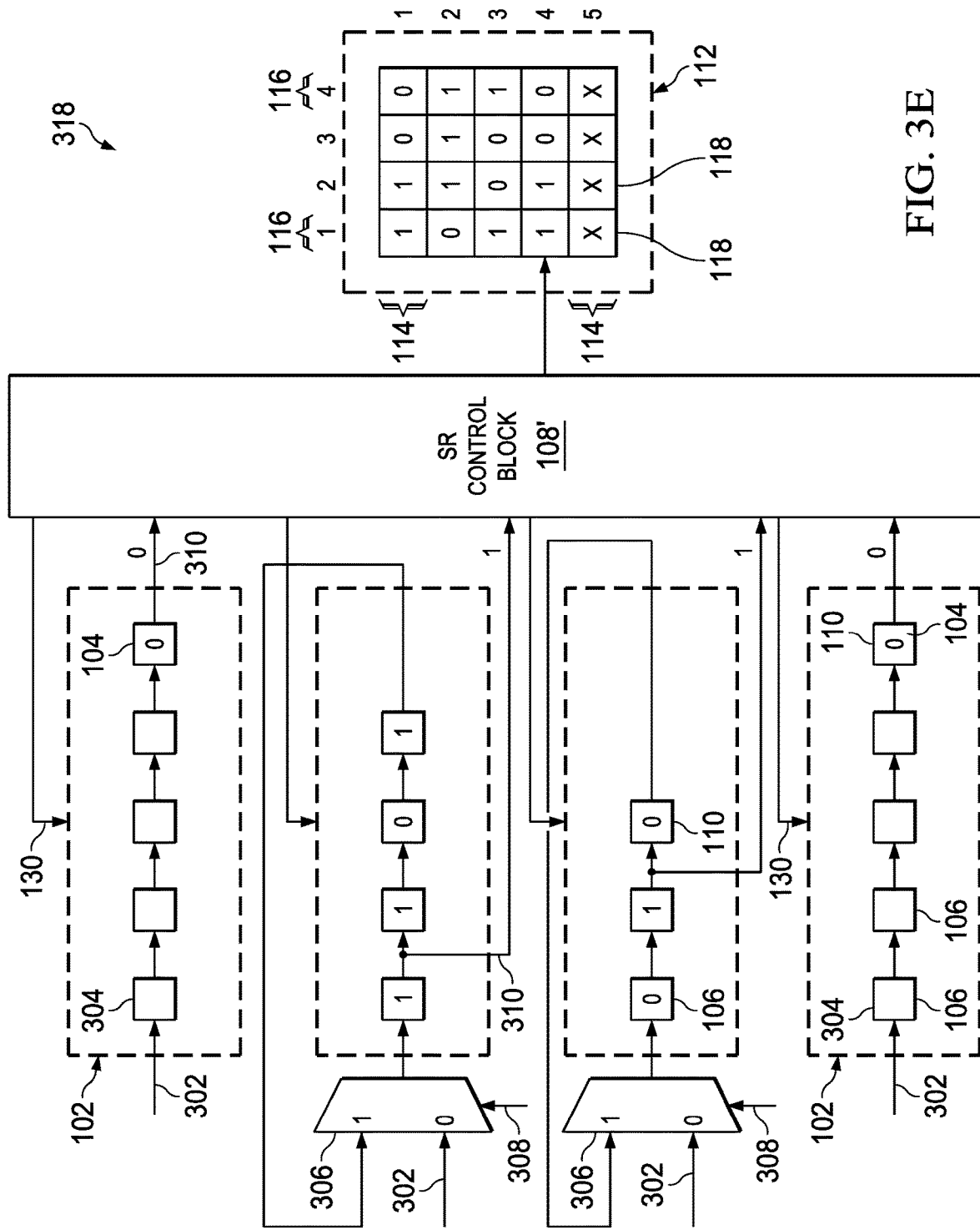
FIG. 3E shows an example block diagram of the circuit for using scan chains to save a state of a design block, after four clock cycles have passed since FIG. 3A.

FIG. 3E shows an example block diagram 318 of a circuit for using scan chains 102 to save a state of a design block, after four clock 130 cycles have passed since FIG. 3A. Data outputted from the scan chains 102 as a result of the most recent clock 130 cycle has been stored in row 4 of the memory 112. The values of the bits 104 which will be outputted by the respective scan chains 102 as a result of the next clock 130 cycle are: CHAIN 1 will output a 0 from the end cell 110 of CHAIN 1; CHAIN 2 will output a 1 from cell 106 one of CHAIN 2; CHAIN 3 will output a 1 from cell 106 two of CHAIN 3; and CHAIN 4 will output a 0 from the end cell 110 of CHAIN 4. Also, the 1 which was stored in the end cell 110 of CHAIN 2 from the immediately-preceding cycle has looped back to and been stored in the first cell 304 of CHAIN 2, and the 0 which was stored in the end cell 110 of CHAIN 3 from the immediately-preceding cycle has looped back to and been stored in the first cell 304 of CHAIN 3 (via respective multiplexers 306). Note that, four clock 130 cycles after FIG. 3D, CHAIN 2 has returned to the arrangement of bit 104 values stored in cells 106 shown in FIG. 3A. This is because M (the length in cells 106 of the scan chain 102) equals four (four cells 106, four clock 130 cycles) for CHAIN 2. This means that the sequence of data outputted by CHAIN 2, and stored by the memory 112, will begin to repeat for the remainder of the state saving process.

Figure 3F:
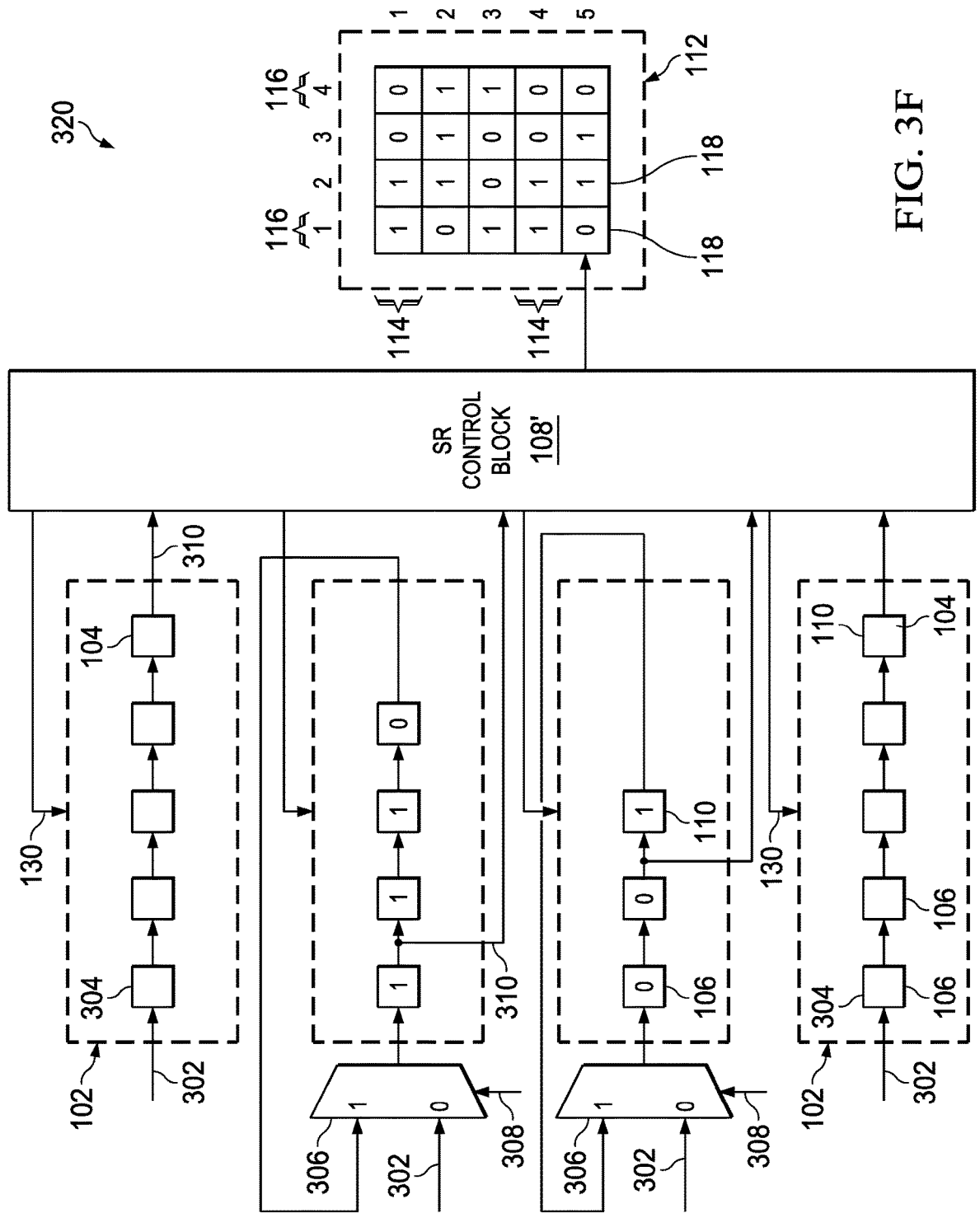
FIG. 3F shows an example block diagram of the circuit for using scan chains to save a state of a design block, after five clock cycles have passed since FIG. 3A.

FIG. 3F shows an example block diagram 320 of a circuit for using scan chains 102 to save a state of a design block, after five clock 130 cycles have passed since FIG. 3A. Data outputted from the scan chains 102 as a result of the most recent clock 130 cycle has been stored in row 5 of the memory 112. The 1 which was stored in the end cell 110 of CHAIN 2 from the immediately-preceding cycle has looped back to and been stored in the first cell 304 of CHAIN 2, and the 0 which was stored in the end cell 110 of CHAIN 3 from the immediately-preceding cycle has looped back to and been stored in the first cell 304 of CHAIN 3 (via respective multiplexers 306).

As a result of the state saving process of FIGS. 3A through 3F, if memory cells 118 in a column P (where P is a number from 1 to 4 corresponding to scan chain P) of the memory 112 are read from row 5 to row 1, the bits 104 stored in the memory cells 118 of column P will be the same bits, in the left-to-right order, as the bits 104 stored in CHAIN P (the scan chain 102 numbered P) in FIG. 3A. For the shorter scan chains 102, this is true with a caveat: the bits 104 stored in the memory cells 118 repeat after the Mth bit 104 (reading upwards in the memory 112 for a given M bits in a scan chain, repetition starts at the (N−M) row 114). This repetition can comprise one or more copies of the bits 104 initially stored in a scan chain 102, or a partial copy of the bits 104 initially stored in a scan chain 102. For example, the initial contents of CHAIN 3 as shown in FIG. 3A, and having M=3 bits, read from the first cell 106 to the third cell 106 of CHAIN 3, are (1, 0, 0). The contents of column 3 of the memory 112 as shown in FIG. 3F, read from row 5 to row 1 of the memory 112, are (1, 0, 0, 1, 0). That is, reading from row 5 to row 1, column 3 of the memory 112 as shown in FIG. 3F contains the initial contents of CHAIN 3, plus (N−M=5−3=2) additional bits of CHAIN 3 as read from the first cell 304 to the third cell 106 (the end cell 110) of CHAIN 3. The shorter scan chains 102 loop from their respective end cells 110 to their respective first cells 304 when bits 104 are progressed through the serially-connected cells 106 by a clock 130 cycle. As a result, during a state restore process when data is loaded back from the memory 112 into respective scan chains 102, repeated bit 104 values (from shorter scan chains 102) will be written over identical, previously-written bit 104 values when those previously-written bit values loop from a scan chain's 102 end cell 110 to the scan chain's 102 first cell 304 (as further described with respect to FIGS. 4A to 4F).

Figure 4A:
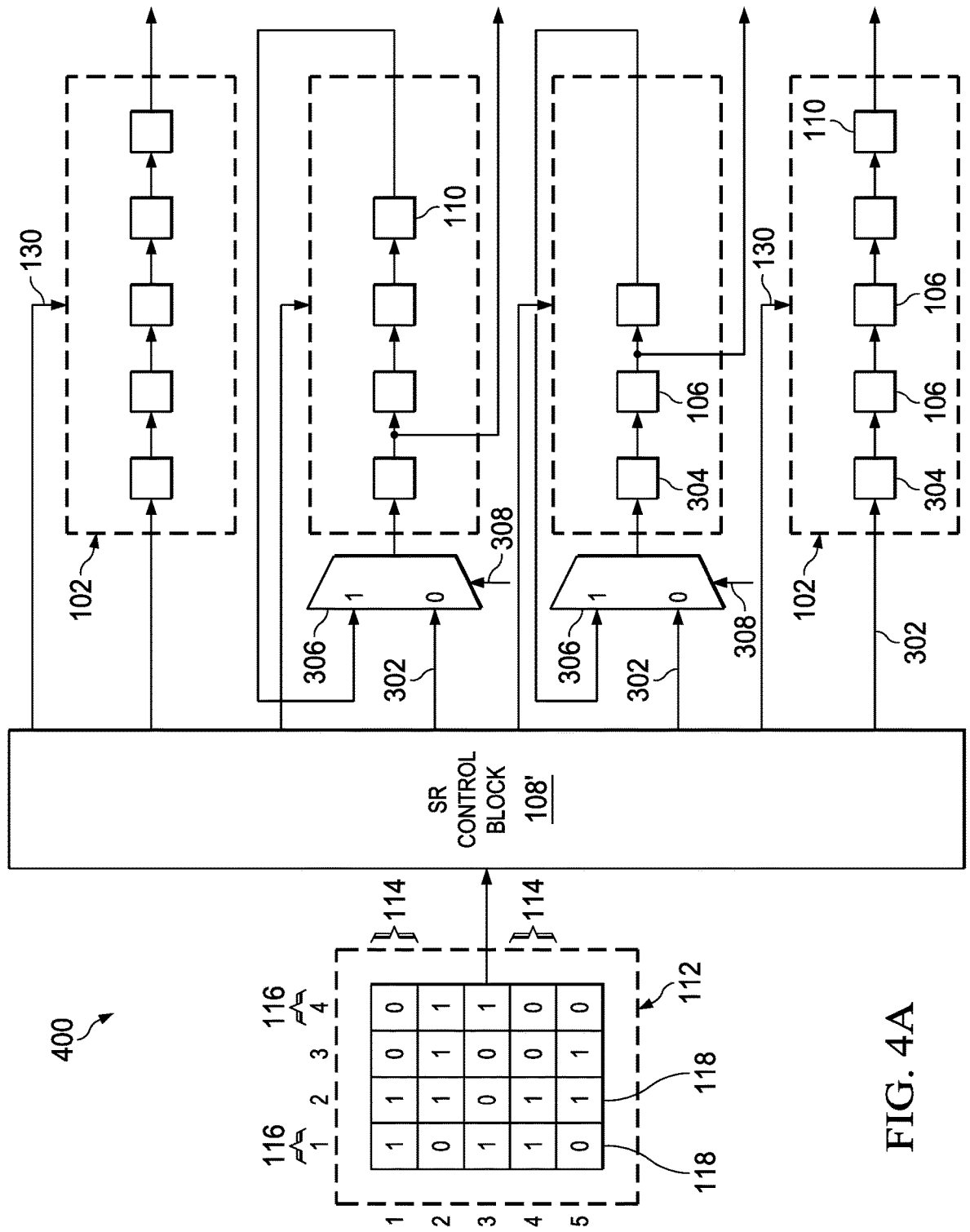
FIG. 4A shows an example block diagram of a circuit for using scan chains to save a state of a design block.

FIG. 4A shows an example block diagram 400 of a circuit for using scan chains 102 to restore a state to scan chains and thence to a design block. Typically, a state restore process will be performed on wake-up of an inactive design block (power-up of the design block). As shown in FIG. 4A, at the beginning of the state restoration process, the memory 112 contains the same data in the same configuration as at the end of the state saving process as shown in FIG. 3F. The memory 112 is connected to output data from a row 114 thereof to the SR control block 108'. The SR control block 108' is configured to output data received from the memory 112 to first cells 304 of respective scan chains 102, and to distribute the clock 130 to the scan chains 102. The clock 130 causes the data received by the scan chains 102 from the SR control block 108' to be stored in corresponding cells 106, and for bits 104 (not shown in FIG. 4A) to be iteratively progressed through the serially connected cells 106 of respective scan chains 102. Shorter scan chains 102 (as shown in FIG. 4A, chains 2 and 3) also loop bits 104 progressed from respective end cells 110 back to respective multiplexers 306. Because the SR mode selector 308 is set to pass newly received data, rather than looped data—which, during the state restore process, means data received from the memory 112—certain data that was looped during the store operations is discarded during the restore operations, and data received from the memory 112 via the SR control block 108' and respective state data inputs 302 is passed by respective multiplexers 306 to be stored in respective first cells 304 (of CHAINS 2 and 3). However, because the data stored in the memory 112 repeat the data initially stored in the shorter scan chains 102, the repeated bits 104 match the looped (and discarded) bits 104. Effectively, the state saving process of FIGS. 3A to 3F pads the memory 112 with the state data stored in the shorter scan chains 102. This avoids zero padding, memory 112 rearrangement, or sacrificing device area to balance scan chain 102 lengths with additional cells 106 (as discussed above with respect to FIGS. 1A to 2F).

In FIGS. 4B through 4F, the arrow from the memory 112 to the SR control block 108' indicates the row 114 that has just been unloaded to reload the scan chains 102.

Figure 4B:
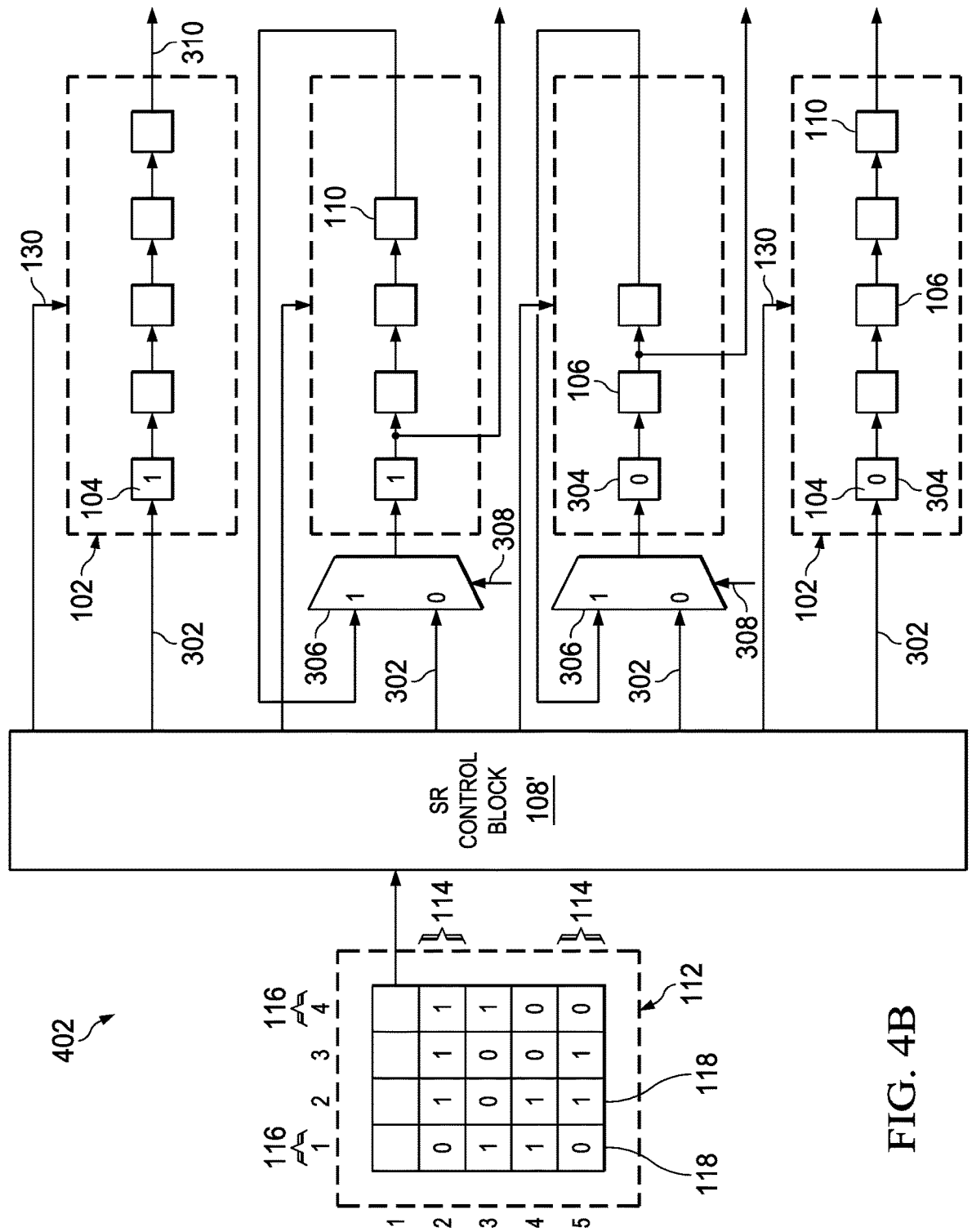
FIG. 4B shows an example block diagram of the circuit for using scan chains to restore a saved state of a design block, after a clock cycle has passed since FIG. 4A.

FIG. 4B shows an example block diagram 402 of a circuit for using scan chains 102 to restore a saved state of a design block, after a clock 130 cycle has passed since FIG. 4A. The clock 130 cycle causes data stored in a first row 114 (row 1) of the memory 112 to be read out from the memory 112 and stored in cells 106 in corresponding scan chains 102. Accordingly, columns 116 in the memory 112 correspond to respective scan chains 102, so that data read out from memory cells 118 in column 1 are stored in CHAIN 1, data read out from memory cells 118 in column 2 are stored in CHAIN 2, and so on. This means that data are returned to the scan chain 102 they were previously read out from in the save process described with respect to FIGS. 3A through 3F.

Figure 4C:
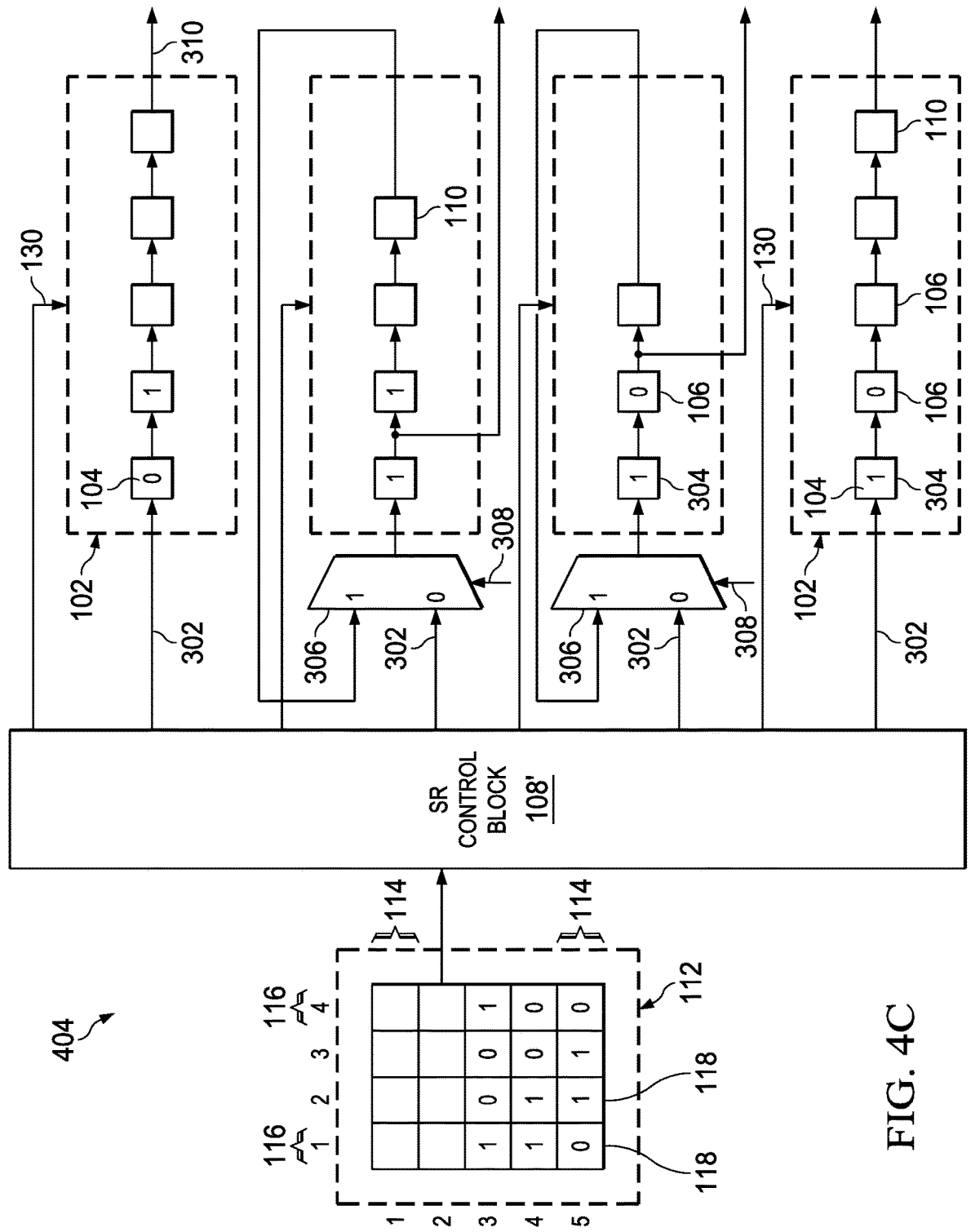
FIG. 4C shows an example block diagram of the circuit for using scan chains to restore a state of a design block, after two clock cycles have passed since FIG. 4A.

FIG. 4C shows an example block diagram 404 of a circuit for using scan chains 102 to restore a state of a design block, after two clock 130 cycles have passed since FIG. 4A. The clock 130 cycle causes the bits 104 stored in the scan chains 102 to be iteratively moved (progressed) through the serially-connected cells 106 in the scan chains 102, and data stored in a second row 114 of memory cells 118 to be read out from the memory 112 and stored in corresponding scan chains 102.

Figure 4D:
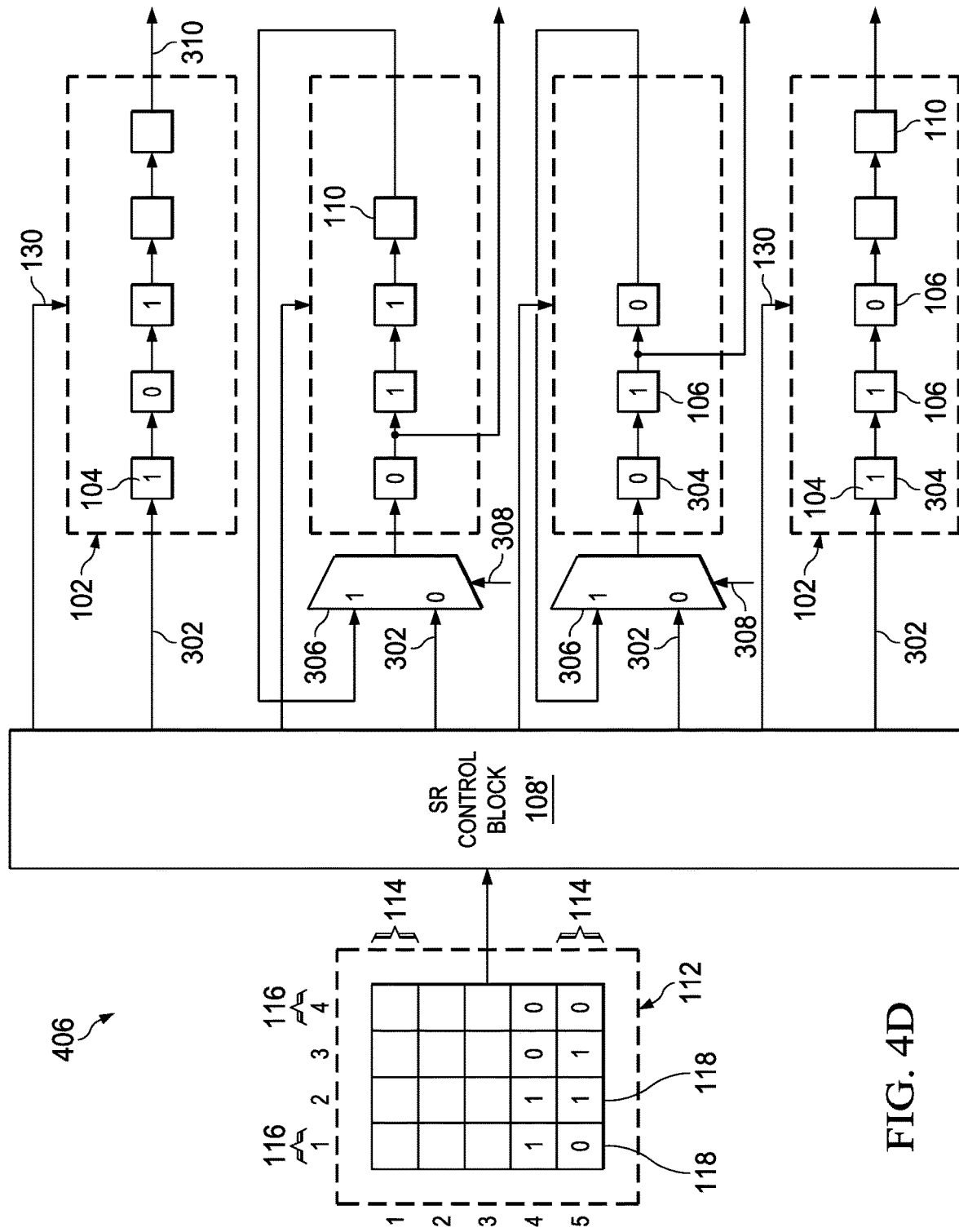
FIG. 4D shows an example block diagram of the circuit for using scan chains to restore a saved state of a design block, after three clock cycles have passed since FIG. 4A.

FIG. 4D shows an example block diagram 406 of a circuit for using scan chains 102 to restore a saved state of a design block, after three clock 130 cycles have passed since FIG. 4A. The clock 130 cycle causes the bits 104 stored in the scan chains 102 to be iteratively moved through the serially-connected cells 106 in the scan chains 102, and data stored in a third row 114 of memory cells 118 to be read out from the memory 112 and stored in corresponding scan chains 102. At this point in the state restoration process, all of the cells 106 in CHAIN 3 contain bits 104, but column 3 of the memory 112 is not yet empty. The data remaining in column 3 of the memory 112 will be stored into cells 106 of CHAIN 3 instead of, as was the case in the save operations, identical data looped from the end cell 110 of CHAIN 3 back to the multiplexer 306 of CHAIN 3. The multiplexer 306 will not pass the looped bits 104, because the SR mode selector 308 is currently selecting for new data to be inputted into the shorter scan chains 106.

Figure 4E:
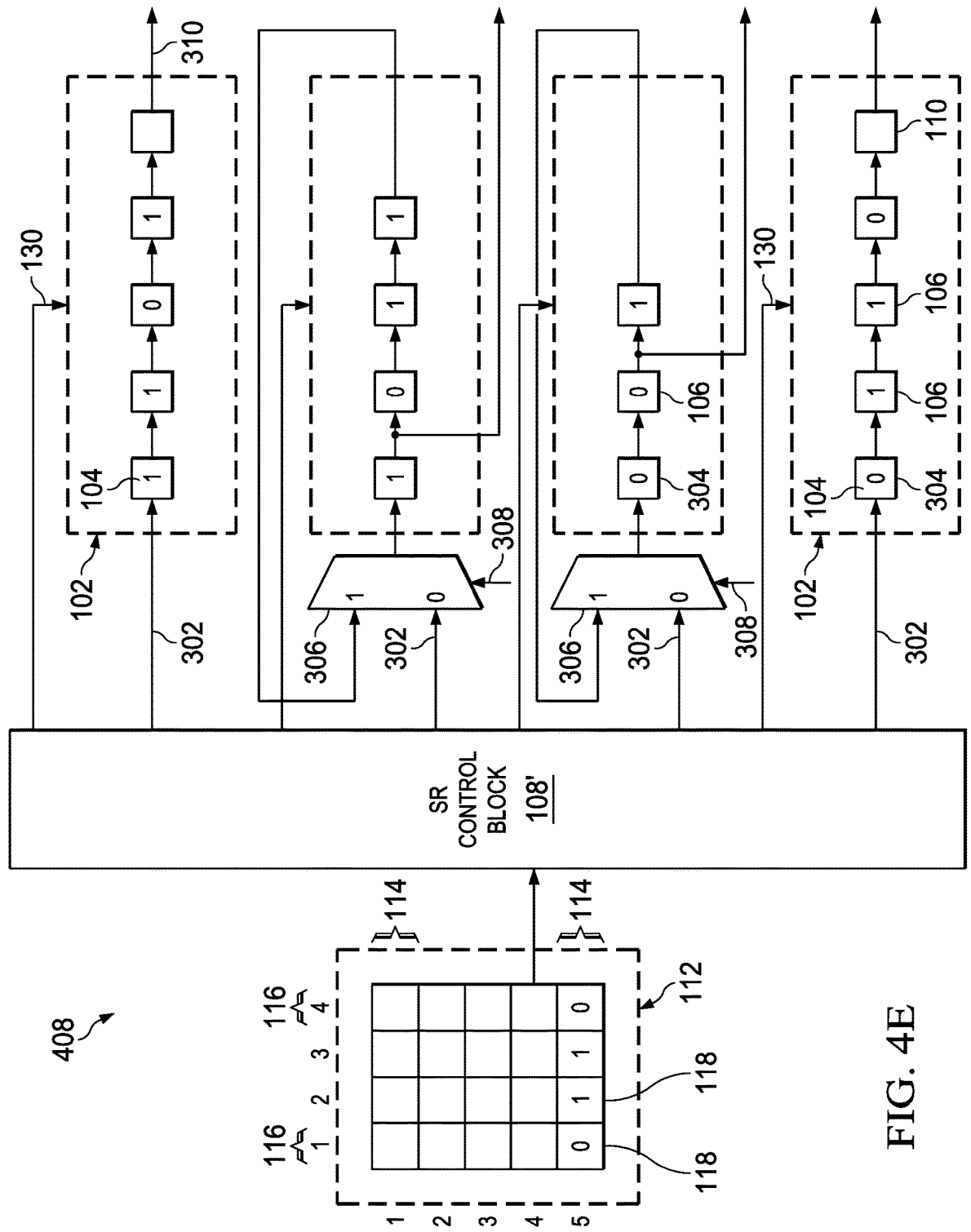
FIG. 4E shows an example block diagram of the circuit for using scan chains to restore a saved state of a design block, after four clock cycles have passed since FIG. 4A.

FIG. 4E shows an example block diagram 408 of a circuit for using scan chains 102 to restore a saved state of a design block, after four clock 130 cycles have passed since FIG. 4A. The clock cycle 130 causes the bits 104 stored in the scan chains 102 to be iteratively moved through the serially-connected cells 106 in the scan chains 102, and data stored in a fourth row 114 of memory cells 118 to be read out from the memory 112 and stored in corresponding scan chains 102. Because the third scan chain 102 (CHAIN 3) is only three cells 106 long, the zero stored in the end cell 110 of chain 3 in FIG. 4D is connected back to an input of the multiplexer 306 of chain 3, but it is effectively discarded because the SR mode selector 308 controls the multiplexer 306 to output data from the SR control block 108' instead of the looped back data. Accordingly, the CHAIN 3 multiplexer 306 outputs the zero previously stored in column 3 (corresponding to CHAIN 3), row 4 (read out of CHAIN 3 in the fourth clock 130 cycle of the state save process, and read out of column 3 of the memory 112 in the fourth clock 130 cycle of the state restore process) of the memory 112, which is thereby stored in the first cell 304 of CHAIN 3.

In FIG. 4E, all cells 106 of CHAIN 2 contain stored bits 104 read from memory 112 during the state restore process. Consequently, the behavior of CHAIN 2 in FIG. 4F (discarded looped bit 104, storage of identical bit 104 read from memory 112) will be similar to the behavior of CHAIN 3 in FIG. 4E.

Figure 4F:
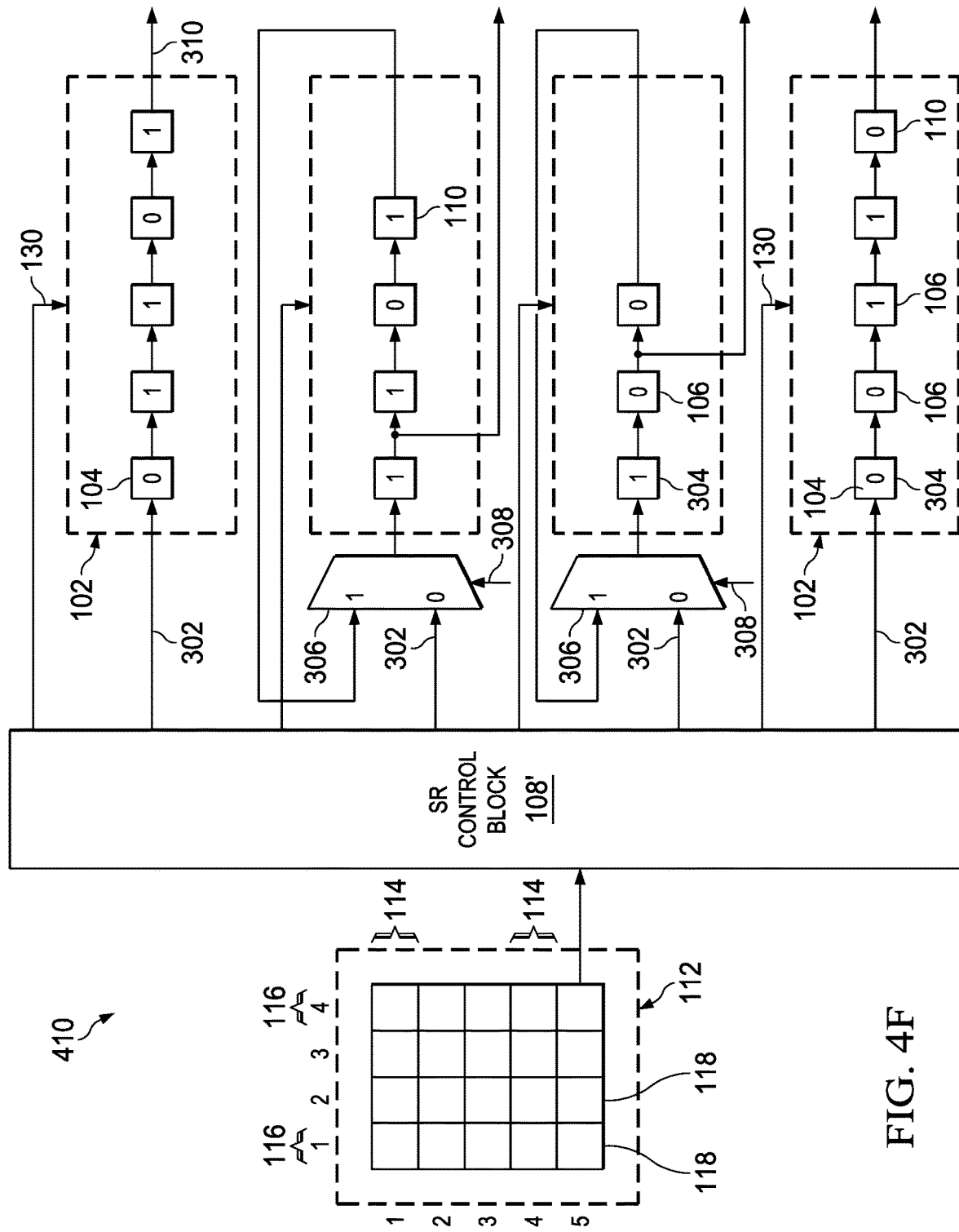
FIG. 4F shows an example block diagram of the circuit for using scan chains to restore a saved state of a design block, after a fifth clock cycle has passed since FIG. 4A.

FIG. 4F shows an example block diagram 410 of a circuit for using scan chains 102 to restore a saved state of a design block, after a fifth clock 130 cycle has passed since FIG. 4A. The clock 130 cycle causes the bits 104 stored in the scan chains 102 to be iteratively moved through the serially-connected cells 106 in the scan chains 102, and data stored in a fifth row 114 of memory cells 118 to be read out from the memory 112 and stored in first cells 304 of corresponding scan chains 102. The ones previously stored in the end cells 110 of CHAINS 2 and 3 are looped back as inputs to respective multiplexers 306 and discarded (due to the SR mode selector 308), and identical ones read out from row 5, columns 2 and 3 of the memory 112 are stored in respective first cells 304 of CHAIN 2 and 3. As shown in FIG. 4F, the scan chains 102 now contain the same bits 104, in the same configuration, as at the start of the save process in FIG. 4A. The data contained in the scan chains 102 can then be used to restore the saved state of the design block, reversing the process used to initially load the state of the design block in to the scan chains 102.

Figure 5A:
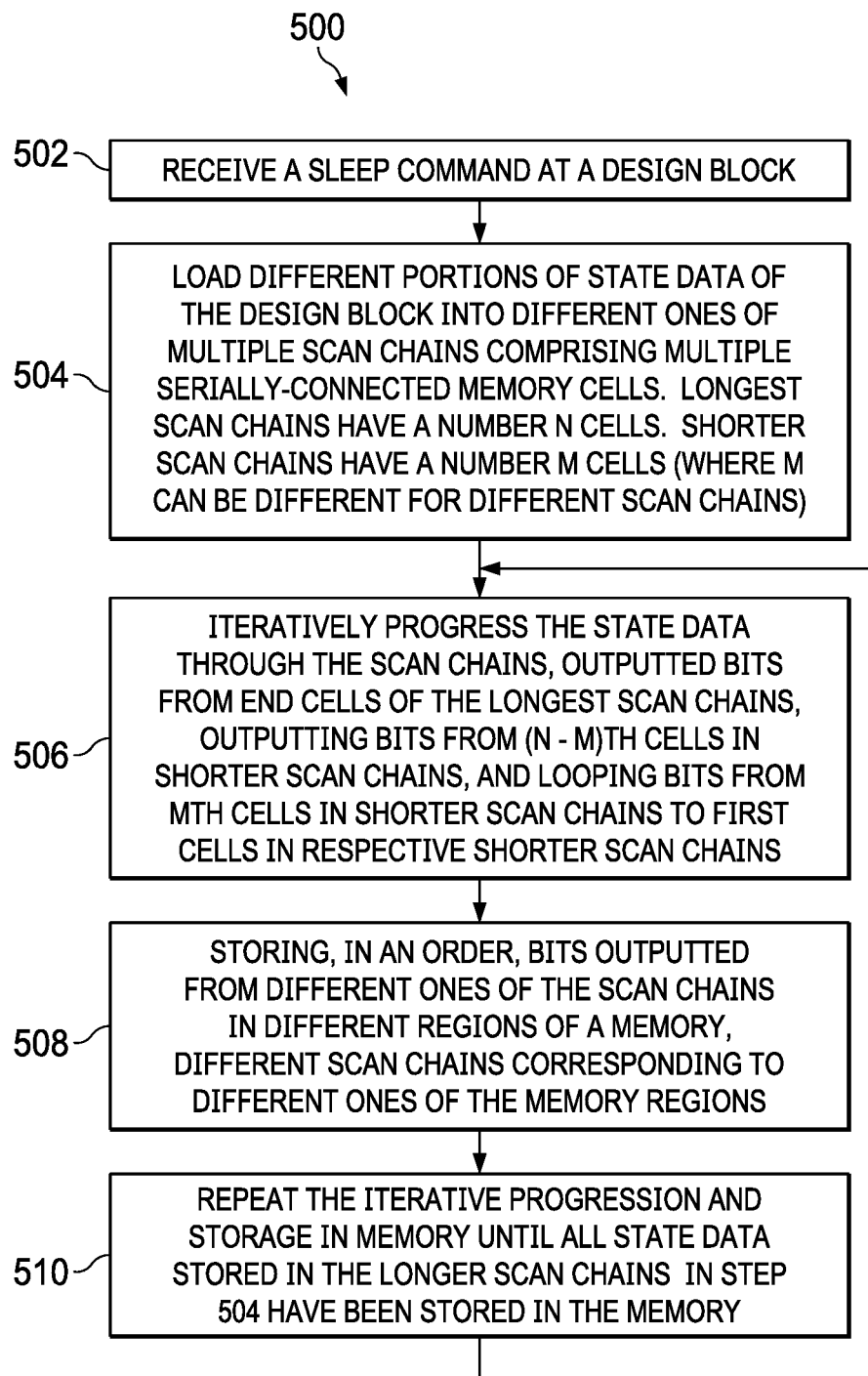
FIG. 5A shows an example process for using scan chains to save a state of a design block.

FIG. 5A shows an example process 500 for using scan chains to save a state of a design block. In step 502, a sleep command is received at a design block, causing the design block to prepare to power down, and then power down. Saving the state of the design block is part of the power down preparation. In step 504, different portions of the state data of the design block are loaded into different ones of multiples scan chains. Scan chains are made up of multiple serially-connected memory cells. The longest scan chains have a number N cells, and shorter scan chains have a number M cells, where M can be different for different scan chains. In step 506, the state data stored in the scan chains is iteratively progressed through the scan chains. Bits are outputted from end cells of the longest scan chains, and bits are outputted from the (N−M)th cells of shorter scan chains. Bits are looped from Mth cells in shorter scan chains to be stored in first cells of respective shorter scan chains. In step 508, bits outputted from different ones of the scan chains are stored, in an order, in different regions of a memory, so that different ones of the scan chains correspond to different ones of the memory regions. In step 510, the iterative progression and storage of steps 506 and 508 are repeated until all state data stored in the longer scan chains in step 504 have been stored in the memory. This will result in more than one copy of the state data stored in shorter scan chains (for example, a copy plus a partial copy) being stored in the memory.

Figure 5B:
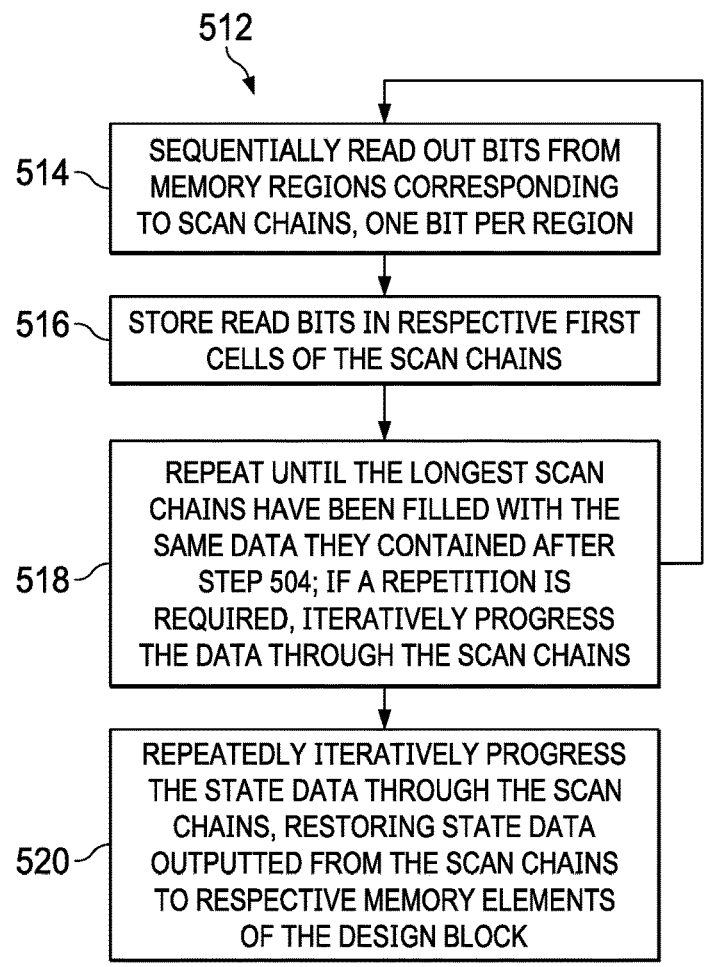
FIG. 5B shows an example process for using scan chains to save a state of a design block.

FIG. 5B shows an example process 500 for using scan chains to save a state of a design block. In step 514, bits are sequentially read out from the memory regions corresponding to the scan chains (as described with respect to step 508), preferably one bit per region per iteration of step 514. In step 516, the bits read out from the memory are stored in respective first cells of the scan chains. In step 518, if the longest scan chains have not yet been (re-)filled with state data, then the state data is iteratively progressed through the scan chains, and steps 514 and 516 are repeated. In step 520, the state data is repeatedly iteratively progressed through the scan chains, and state data outputted from the scan chains is restored to respective memory elements of the design block.

Figure 6A:
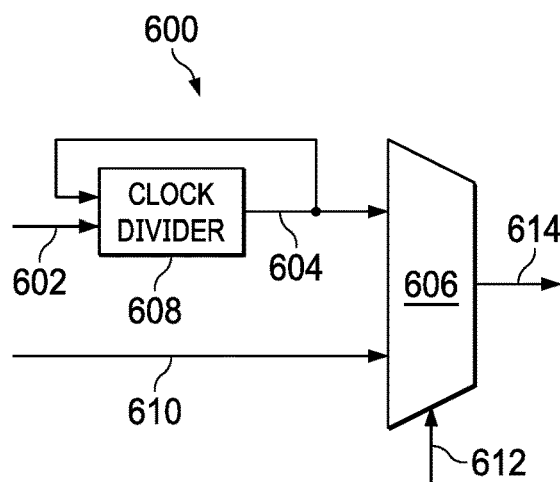
FIG. 6A shows an example block diagram for a clock circuit used to provide a clock for scan chains used to save a state of a design block.

FIG. 6A shows an example block diagram for a clock circuit 600 used to provide a clock for scan chains used to save a state of a design block. The clock circuit 600 comprises a clock divider 608 which receives a reference clock 602 as an input, and connected to output a divided clock signal $CLK_{DIV}$ 604 as an input to itself (feedback), and as an input to a multiplexer 606. The multiplexer 606 also receives a save-restore clock $CLK_{SR}$ 610 as an input. An SR Mode 612 selector selects whether the multiplexer 606 outputs $CLK_{DIV}$ 604 or $CLK_{SR}$ 610 as a multiplexer output 614. During normal function of the design block, the multiplexer 606 outputs $CLK_{DIV}$ 604 for use by the design block. During a state saving process or a state restoration process, the multiplexer 606 outputs $CLK_{SR}$ 610 for use by scan chains and related circuits.

FIG. 6B shows an example timing diagram 611 for the clock circuit 600. As shown in FIG. 6B, SR Mode 612 is initially set high, corresponding to a design block idle state (e.g., a powered-down state) in which SR (save-restore) functionality has been triggered. SR Mode 612 later transitions to a low state, indicating a transition of the design block from an idle state to a functional (e.g., powered-up) state and a corresponding transition from a save-restore mode to a functional mode. $CLK_{DIV}$ 604 starts low, and transitions to high prior to SR Mode 612 transitioning to low (that is, prior to the design block transitioning from a save-restore mode to a functional mode). During the time period shown in FIG. 6B, $CLK_{SR}$ 610 is initially oscillating, and ceases oscillating prior to SR Mode 612 going low, that is, when a state restoration process is completed. The multiplexer output 614 initially follows $CLK_{SR}$ 610, and goes high to follow $CLK_{DIV}$ 604 when SR Mode 612 goes low (SR Mode 612 changing resulting in the selected multiplexer output 614 changing). This transition by the multiplexer output 614, creating a rising clock edge 616, occurs at the same time as SR Mode 612 transitioning. This can be problematic: the rising clock edge 616 in the multiplexer output 614 indicates a clock transition (rising clock edge) where there is no clock transition, which can result in clocked circuits exhibiting unintended (erroneous) behavior.

Figure 6C:
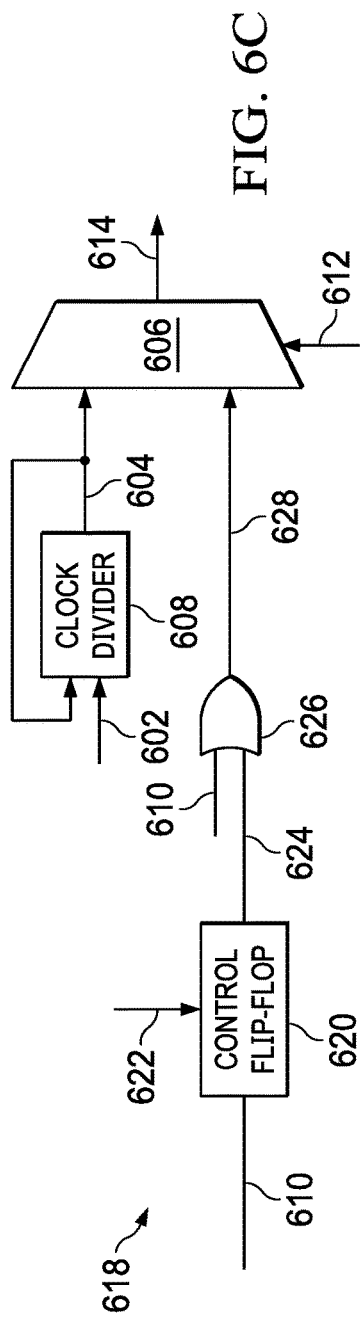
FIG. 6C shows an example block diagram for a clock circuit used to provide a clock for scan chains used to save a state of a design block, and configured to suppress false clock transitions at SR Mode transitions.

FIG. 6C shows an example block diagram for a clock circuit 618 used to provide a clock for scan chains used to save a state of a design block, and configured to suppress false clock transitions at SR Mode 612 transitions. The clock circuit 618 includes a control flip-flop 620, which receives $CLK_{SR}$ 610 and a RESET signal 622 as inputs, and is connected to output a transitional clock $CLK_{XN}$ 624 to an OR logic gate 626. The OR logic gate 626 also receives $CLK_{SR}$ 610 as an input. The OR logic gate 626 outputs a gated save-restore clock $CLK_{SR\_G}$ 628 to the multiplexer 606. SR Mode 620 selects whether the multiplexer 606 outputs $CLK_{DIV}$ 604 or $CLK_{SR\_G}$ 628 as the multiplexer output 614. During normal function of the design block, the multiplexer 606 outputs $CLK_{DIV}$ 604 for use by the design block. During a state saving process or a state restoration process, the multiplexer 606 outputs $CLK_{SR\_G}$ 628 for use by scan chains and related circuits.

Figure 6D:
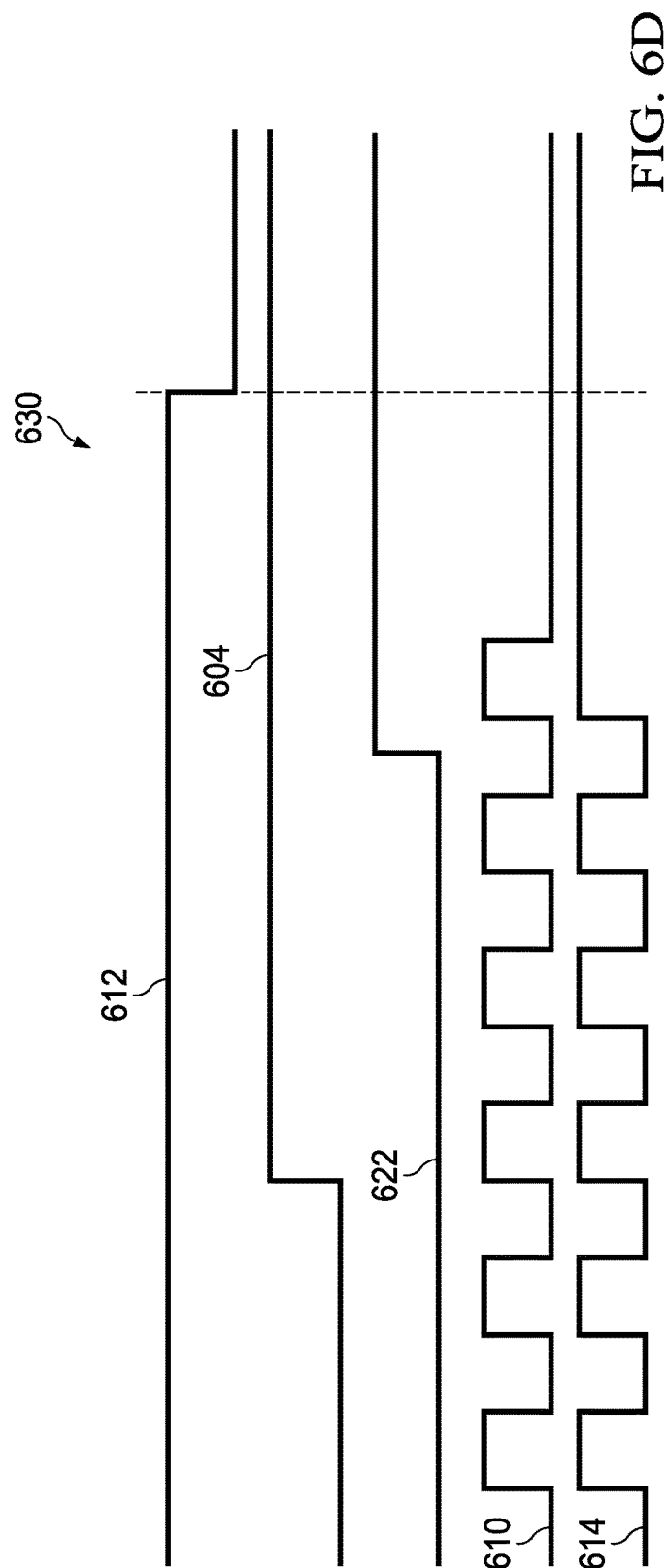
FIG. 6D shows an example timing diagram for the clock circuit.

FIG. 6D shows an example timing diagram 630 for the clock circuit 618. Signal timings shown in FIG. 6D are the same as in FIG. 6B, except for the addition of the RESET signal 622 and its effects on the multiplexer output 614. The RESET signal 622 starts low, and goes high when the state restoration process concludes, prior to SR Mode 612 going high, and remains high until the transition from the idle state to the functional state is complete. The RESET signal 622 causes $CLK_{XN}$ 624 (not shown) to go high, which causes $CLK_{SR\_G}$ 628 (not shown) to go high, which causes the multiplexer output 614 to remain high. This prevents the multiplexer output 614 from showing false rising edge transitions.

FIGS. 6A, 6B, 6C, and 6D address an idle state to functional state transition in a design block. The clock circuit 618 of FIG. 6C can also be used suppress false clock transitions during a functional state to SR state transition in a design block by activating the RESET signal 622 prior to SR Mode 612 going high, and remains high until the transition to the idle state is complete (for example, when a state saving process is ready to begin). As will be apparent to one of ordinary skill in the art of save-restore functionality in integrated circuits, the clock circuit 618 can also be modified to prevent both false rising edge transitions and false falling edge transitions.

Modifications are possible in the described embodiments, and other embodiments are possible, within the scope of the claims.

In some embodiments, a memory cell can store more than one bit. In some embodiments, different memory cells can store different numbers of bits.

In some embodiments, different numbers of cells and different sizes of memory can be used than described herein.

In some embodiments, different numbers of clock cycles can be used to progress bits through scan chains.

In some embodiments, a propagation signal (a signal to cause serial progression of bits through a scan chain) other than a clock signal can be used.

In some embodiments, bits read out from scan chains are stored non-consecutively in the memory. In some embodiments, bits are stored in a different order (for example, boustrophedonically) in the memory. In some embodiments, bits from a scan chain are stored in the same column, rather than on the same row, of the memory. In some embodiments, bits from a scan chain are stored from the bottom upwards in the memory.

In some embodiments, additional copies of the state data can be stored in the memory during a save state process.

In some embodiments, the order in which state data is stored in the memory is not the same as the order in which state data is stored in scan chains.

In some embodiments, the memory into which state data is loaded from the scan chains is on the same die as the design block; in some embodiments, the memory into which state data is loaded from the scan chains is on a different die from the design block.

In some embodiments, in an initialization action, data is initially loaded into a scan chain serially (such as via the first cell of the scan chain). In some embodiments, in an initialization action, data is initially loaded into a scan chain in parallel, such as by loading all data into corresponding cells of a scan chain during the same clock cycle, or by loading multiple bits directly into corresponding cells of a scan chain during individual clock cycles.

In some embodiments, circuitry for saving and restoring a state of a design block includes multiple first memories (such as scan chains 102) and a second memory (such as a memory 112). The first memories are configured to, during an initialization action, receive first data (such as state data) from memory elements (such as registers and flip-flops) of the design block. The first memories store, in a first order, different portions of the first data in different ones of the first memories (such as scan chains 102 storing state data in a particular serial order as shown in FIG. 3A). Different ones of the first memories have different numbers of memory cells (such as different scan chains 102 having different numbers of cells 106), ones of the first memory(s) with the most memory cells having a number N memory cells, and ones of the first memory(s) with fewer memory cells having a number M memory cells. The second memory is coupled to the first memories. During a save state action, the first data (state data) is read from the first memories (scan chains 102) and stored in the second memory (the memory 112), the portions of the first data stored in different ones of the first memories being written in a second order to different corresponding regions of the second memory as second data (for example, state data in scan chains 102 being written into corresponding columns 116 of the memory 112). The second order includes repeated portions of the first data stored in sequentially first N minus M memory cells, as determined using the first order, of corresponding ones of the first memories with fewer memory cells (for example, bits 104 stored in the first N minus M cells 106 of shorter scan chains 102 are repeated in the memory 112 because of looped inputs and the locations of outputs 310 in shorter scan chains 102, and because N clock cycles are used to output M distinct bits 104 from shorter scan chains 102, where N>M). During a restore state action, different portions of the second data are read from the second memory and stored, in the first order, in different corresponding ones of the first memories (state data is outputted from the memory 112 back into corresponding scan chains 102 so that the state data is stored by the scan chains 102 in the same order as when the state data was initially stored in the scan chains 102), and the repeated portions are stored, in the first order, in corresponding ones of the first memories with fewer memory cells in which identical portions of the second data have already been stored (bits 104 repeated in the memory 112 are stored in the scan chains 102 in the initial serial order, as shown in, for example, FIGS. 4E and 4F).

What is claimed is:

1. A method, comprising:
   receiving a restore command to perform a state restoration process;
   generating a gated clock signal;
   after receiving the restore command, generating a reset signal when the state restoration process concludes to cause the gated clock signal to cease oscillating; and
   in response to the restore command, restoring a state of the design block from a memory that includes:
   reading, by a control block and based on the gated clock signal, a bit from a first region of the memory, wherein the first region of the memory corresponds to a first scan chain;
   reading, by the control block and based on the gated clock signal, a bit from a second region of the memory, wherein the second region of the memory corresponds to a second scan chain;
   storing, by the control block, the bit from the first region of the memory into a cell of the first scan chain of the design block;
   receiving, at a first input of a multiplexer, the bit from the second region of the memory, wherein a second input of the multiplexer is coupled to an end cell of the second scan chain, and wherein an output of the multiplexer is coupled to the second scan chain;
   receiving, by the second scan chain, the bit from the second region of the memory in response to a multiplexer mode selector receiving the restore command; and
   storing, by the control block, the bit from the second region of the memory into a cell of the second scan chain of the design block.

2. The method of claim 1, wherein:
   the first scan chain has a first number of cells; and
   the second scan chain has a second number of cells, wherein the second number of cells is less than the first number of cells.

3. The method of claim 2, further comprising:
   a third scan chain having a third number of cells, wherein the third number of cells is less than the first number of cells and the third number of cells is different than the second number of cells;
   reading, by the control block, a bit from a third region of the memory, wherein the third region of the memory corresponds to the third scan chain; and
   storing, by the control block, the bit from the third region of the memory into a cell of the third scan chain of the design block.

4. The method of claim 3, wherein:
   the first number of cells are serially connected,
   the second number of cells are serially connected, and
   the third number of cells are serially connected.

5. The method of claim 3, further comprising:
   iteratively repeating, based on the gated clock signal, the steps of reading and storing a number of times equal to the first number of cells.

6. The method of claim 3, wherein:
   the control block reads the bit from the first region of the memory sequentially one bit per iteration;
   the control block reads the bit from the second region of the memory sequentially one bit per iteration; and
   the control block reads the bit from the third region of the memory sequentially one bit per iteration.

7. The method of claim 1, wherein:
   the restore command powers on an inactive design block.

8. A circuit for performing a state restoration process, the circuit comprising:
   a first set of memory cells coupled in a first scan chain, wherein the first set of memory cells has a first number of cells;
   a second set of memory cells coupled in a second scan chain, wherein the second set of memory cells has a second number of cells less than the first number of cells;
   a memory;
   a clock circuit configured to:

generate a gated clock signal; and
generate a reset signal when the state restoration process concludes to cause the gated clock signal to cease oscillating; and
a memory controller configured to:
during the state restoration process and based on the gated clock signal, cause the memory to output a set of data; and
during the state restoration process and based on the gated clock signal, cause the first and second sets of memory cells to store the set of data outputted by the memory.

9. The circuit of claim 8, wherein the clock circuit comprises:
a flip-flop including a first input configured to receive the reset signal, wherein the flip-flop also includes an output; and
a logic gate including a first input coupled to the output of the flip-flop, wherein the logic gate further includes an output, and wherein the logic gate is configured to generate the gated clock signal at the output of the logic gate.

10. The circuit of claim 9,
wherein the clock circuit further comprises a multiplexer including a first input coupled to the output of the logic gate, and
wherein the multiplexer also includes an output coupled to the first and second sets of memory cells.

11. The circuit of claim 9,
wherein the flip-flop further includes a second input configured to receive a save-restore clock signal, and
wherein the logic gate further includes a second input configured to receive the save-restore clock signal.

12. The circuit of claim 8, wherein the clock circuit comprises:
a clock divider circuit including an output; and
a multiplexer including:
a first input configured to receive the gated clock signal; and
a second input coupled to the output of the clock divider circuit.

13. The circuit of claim 12, wherein the multiplexer is configured to:
during the state restoration process, output the gated clock signal to the first and second sets of memory cells;
receive a divided clock signal from the clock divider circuit; and
during a functional mode after the state restoration process concludes, output the divided clock signal to the first and second sets of memory cells.

14. The circuit of claim 8,
wherein the memory controller is configured to:
receive a mode selector signal; and
initiate the state restoration process based on the mode selector signal, and
wherein the clock circuit comprises a multiplexer including:
a first data input configured to receive the gated clock signal; and
a select input configured to receive the mode selector signal.

15. A circuit comprising:
a controller including a first input, a second input, a first output, and a second output;
a first scan chain including a first number of memory cells coupled in series, wherein the first scan chain includes:
a first cell coupled to the first output of the controller; and
a second cell coupled to the first input of the controller;
a second scan chain including a second number of memory cells coupled in series, wherein the second number of memory cells is less than the first number of memory cells, and wherein the second scan chain includes:
a third cell coupled to the second output of the controller;
a fourth cell coupled to the third cell; and
a fifth cell that is an intermediate cell in the second scan chain that is coupled to the second input of the controller; and
a clock circuit including:
a flip-flop including an output;
a logic gate including an input coupled to the output of the flip-flop, wherein the logic gate also includes an output; and
a multiplexer including a first input coupled to the output of the logic gate, wherein the multiplexer also includes an output coupled to the first, second, third, fourth, and fifth cells.

16. The circuit of claim 15, wherein the clock circuit further comprises a clock divider including:
an input; and
an output coupled to the input of the clock divider,
wherein the multiplexer further includes a second input coupled to the input of the clock divider.

17. The circuit of claim 15,
wherein the flip-flop is configured to:
receive a save-restore clock signal;
receive a reset signal; and
generate a transitional clock signal based on the save-restore clock signal and further based on the reset signal,
wherein the logic gate is configured to:
receive the save-restore clock signal;
receive the transitional clock signal; and
generate a gated clock signal based on the save-restore clock signal and further based on the transitional clock signal, and
wherein the multiplexer is configured to:
receive the gated clock signal; and
generate and deliver a composite clock signal to the first, second, third, fourth, and fifth cells.

18. The circuit of claim 15, wherein the flip-flop further comprises:
a first input configured to receive a save-restore clock signal; and
a second input configured to receive a reset signal.

19. The circuit of claim 15, wherein the logic gate comprises an OR gate comprising:
a first input coupled to the output of the flip-flop;
a second input configured to receive a save-restore clock signal; and
an output coupled to the first input of the multiplexer.

20. The circuit of claim 15,
wherein the multiplexer further comprises a select input configured to receive a restore command,
wherein the controller is configured to:
receive the restore command; and
perform a state restoration process in response to receiving the restore command, and
wherein the clock circuit is configured to:

generate a reset signal when the state restoration process concludes to cause a gated clock signal to cease oscillating; and deliver the reset signal to the flip-flop.

* * * * *